United States Patent
Konno et al.

(10) Patent No.: US 10,844,086 B2
(45) Date of Patent: Nov. 24, 2020

(54) METHOD FOR PRODUCING HALOGEN-CROSSLINKED IRIDIUM DIMER

(71) Applicant: NATIONAL INSTITUTE OF ADVANCED INDUSTRIAL SCIENCE AND TECHNOLOGY, Tokyo (JP)

(72) Inventors: Hideo Konno, Tsukuba (JP); Junichi Taniuchi, Tsukuba (JP); Rumi Kobayashi, Tsukuba (JP); Yasushi Masahiro, Tokyo (JP)

(73) Assignee: NATIONAL INSTITUTE OF ADVANCED INDUSTRIAL SCIENCE AND TECHNOLOGY, Tokyo (JP)

( * ) Notice: Subject to any disclaimer, the term of this patent is extended or adjusted under 35 U.S.C. 154(b) by 0 days.

(21) Appl. No.: 16/301,172

(22) PCT Filed: Jun. 16, 2017

(86) PCT No.: PCT/JP2017/022404
§ 371 (c)(1),
(2) Date: Nov. 13, 2018

(87) PCT Pub. No.: WO2017/221848
PCT Pub. Date: Dec. 28, 2017

(65) Prior Publication Data
US 2019/0211041 A1   Jul. 11, 2019

(30) Foreign Application Priority Data

Jun. 24, 2016   (JP) ................ 2016-125399

(51) Int. Cl.
| | |
|---|---|
| *C07F 15/00* | (2006.01) |
| *H01L 51/00* | (2006.01) |
| *C09K 11/06* | (2006.01) |
| *H01L 51/50* | (2006.01) |

(52) U.S. Cl.
CPC .......... *C07F 15/0033* (2013.01); *C07F 15/00* (2013.01); *C07F 15/004* (2013.01); *C09K 11/06* (2013.01); *H01L 51/0085* (2013.01); *C09K 2211/1029* (2013.01); *C09K 2211/1037* (2013.01); *C09K 2211/1044* (2013.01); *C09K 2211/185* (2013.01); *H01L 51/5016* (2013.01)

(58) Field of Classification Search
CPC ..................................................... C07F 15/00
USPC ......................................................... 556/137
See application file for complete search history.

(56) References Cited

U.S. PATENT DOCUMENTS

| | | | |
|---|---|---|---|
| 2001/0019782 A1 | 9/2001 | Igarashi et al. | |
| 2013/0112920 A1 | 5/2013 | Stoessel et al. | |
| 2014/0306203 A1 | 10/2014 | Akino et al. | |
| 2015/0171348 A1 | 6/2015 | Stoessel et al. | |
| 2015/0318498 A1 | 11/2015 | Stoessel et al. | |
| 2015/0333280 A1 | 11/2015 | Stoessel et al. | |
| 2015/0349277 A1 | 12/2015 | Stoessel et al. | |
| 2016/0233443 A1* | 8/2016 | Stoessel ................. | C09K 11/06 |
| 2016/0326198 A1 | 11/2016 | Konno et al. | |
| 2017/0166599 A1 | 6/2017 | Abe et al. | |

FOREIGN PATENT DOCUMENTS

| | | |
|---|---|---|
| JP | 2001-345183 A | 12/2001 |
| JP | 2003-231692 A | 8/2003 |
| JP | 2012-6914 A | 1/2012 |
| JP | 2013-147551 A1 | 8/2013 |

(Continued)

OTHER PUBLICATIONS

EP, Extended Search Report for European Application No. 17815316.9, dated Apr. 8, 2019.

(Continued)

*Primary Examiner* — Douglas M Willis
(74) *Attorney, Agent, or Firm* — Orrick, Herrington & Sutcliffe LLP; Joseph A. Calvaruso; K. Patrick Herman

(57) ABSTRACT

A method for producing a halogen-crosslinked iridium dimer with increased purity that is used as a precursor in production of a cyclometalated iridium complex useful as a phosphorescent material for organic electroluminescent devices, organic electrochemiluminescent devices, luminescent sensors, photosensitizing pigments, photocatalysts, luminescent probes, various light sources, and the like. The halogen-crosslinked iridium dimer is represented by the following formula:

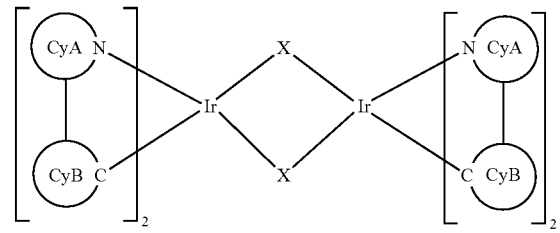

In this formula, each X represents a halogen atom, each CyA represents an optionally substituted five- or six-membered cyclic ring containing nitrogen atoms, and is linked to iridium via the nitrogen atoms, and each CyB represents an optionally substituted five- or six-membered ring containing carbon atoms, and is linked to iridium via the carbon atoms. CyA and CyB can be linked together to form an optionally substituted ring.

3 Claims, No Drawings

(56) References Cited

FOREIGN PATENT DOCUMENTS

| | | |
|---|---|---|
| JP | 2014-205643 A | 10/2014 |
| JP | 2016-507490 A | 3/2016 |
| WO | WO 02/067343 A1 | 8/2002 |
| WO | WO 03/079736 A1 | 9/2003 |
| WO | WO 2006-097717 A1 | 9/2006 |
| WO | WO 2008/109824 A2 | 9/2008 |
| WO | WO 2012/007086 A1 | 1/2012 |
| WO | WO 2012/057139 A1 | 5/2012 |
| WO | WO 2015/104961 A1 | 7/2015 |
| WO | WO 2016/006523 A1 | 1/2016 |

OTHER PUBLICATIONS

PCT, International Search Report for PCT/JP2017/022404, dated Aug. 15, 2017.

* cited by examiner

METHOD FOR PRODUCING HALOGEN-CROSSLINKED IRIDIUM DIMER

CROSS-REFERENCE TO RELATED APPLICATIONS

This application is claims priority to, and it is a national phase of, International application no. PCT/JP2017/022404, filed on Jun. 16, 2017 which claims the benefit of, and priority to, Japanese application no. 2016-125399, filed Jun. 24, 2016, the disclosures of which are hereby incorporated herein by reference in their entireties and for all purposes.

BACKGROUND OF THE INVENTION

Field of the Invention

The present invention relates to a method for efficiently producing a halogen-crosslinked iridium dimer with a favorable purity, the halogen-crosslinked iridium dimer as a precursor in production of a cyclometalated iridium complex that is used as a phosphorescent material to be used for organic electroluminescent (EL) devices, organic electrochemiluminescent (ECL) devices, luminescent sensors, photosensitizing pigments, photocatalysts, luminescent probes, various light sources, and the like.

Description of Related Art

"Cyclometalated iridium complex" that is used as a phosphorescent material for organic electroluminescent (EL) devices and the like is a general term for organic iridium complexes, in which multidentate ligands are coordinated to the iridium atom to form a ring, and at least one iridium-carbon bond is present. Organic EL devices obtained by use of a phosphorescent material have light-emitting efficiency 3 to 4 times higher than that of organic EL devices obtained by use of a conventional fluorescent material, and therefore a cyclometalated iridium complex is essential to achieve higher efficiency/energy saving in organic EL devices. As cyclometalated iridium complexes to be applied as phosphorescent materials, many iridium complexes are known such as, for example, a cyclometalated iridium complex coordinated with an aromatic bidentate ligand such as a 2-phenylquinoline derivative (Chemical Formula 1) (see Patent Document 1).

[Chemical Formula 1]

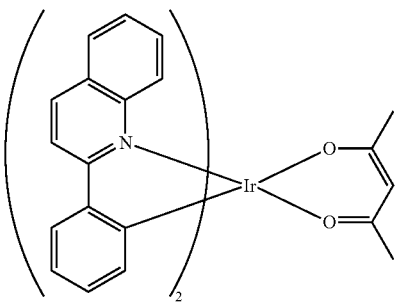

Here, as a method for producing a cyclometalated iridium complex, a two-step synthetic route is known in which an iridium compound raw material is reacted with a compound as a ligand to produce a halogen-crosslinked iridium dimer, and from the halogen-crosslinked iridium dimer as a precursor, a desired cyclometalated iridium complex is obtained. Specifically, for the cyclometalated iridium complex of Chemical Formula 1 which is described in Patent Document 1, the following synthetic route is known.

[Chemical Formula 2]

[first step]

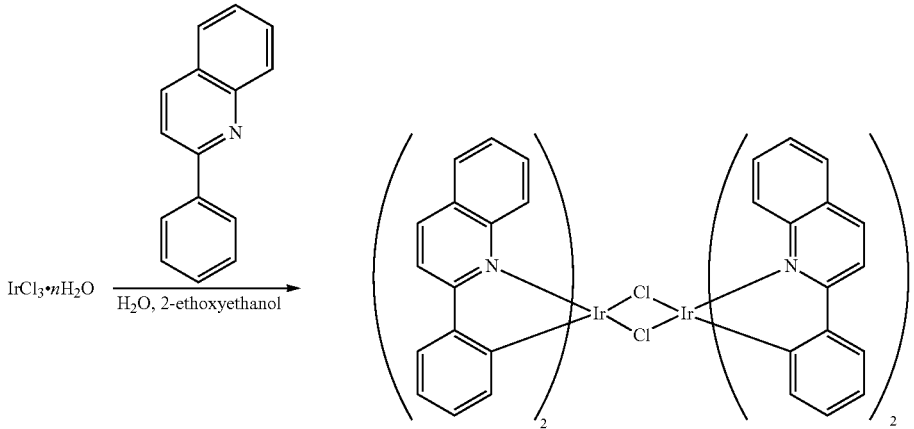

[second step]

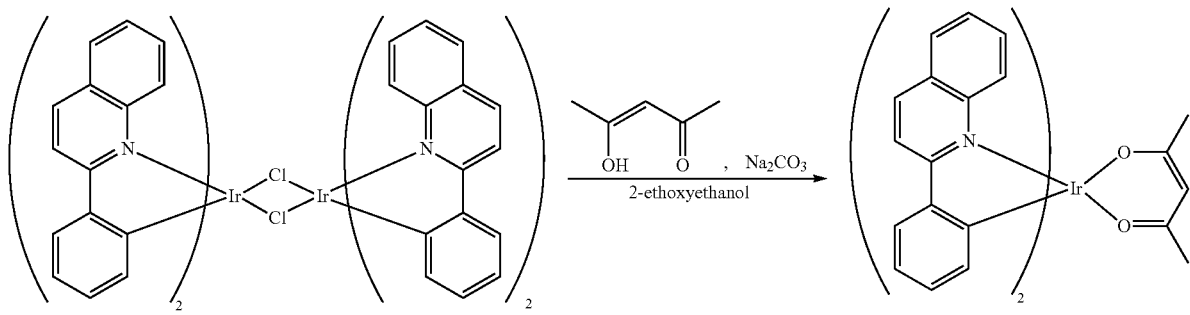

[first step]: iridium trichloride is reacted with 2-phenylquinoline to synthesize a halogen-crosslinked iridium dimer.
[second step]: the synthesized halogen-crosslinked iridium dimer is reacted with acetylacetone to synthesize a cyclometalated iridium complex.

As other examples of the method for producing a cyclometalated iridium complex, which has a two-step synthetic route as described above, for example, Patent Document 2 suggests that a halogen-crosslinked iridium dimer was obtained by reacting iridium trichloride with 2-(3,5-dimethylphenyl)quinoline as a 2-phenylquinoline-based ligand.

[Chemical Formula 3]

[first step]

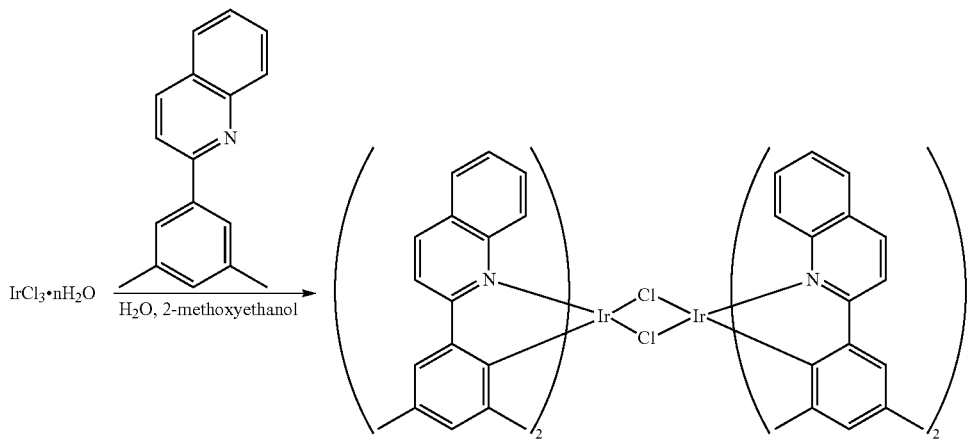

[second step]

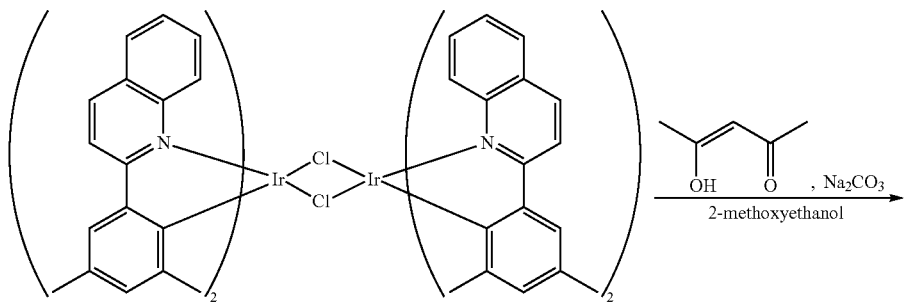

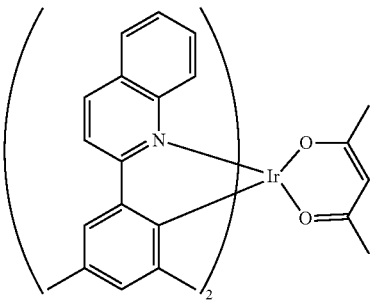

Here, it may be preferable to efficiently produce a halogen-crosslinked iridium dimer as a precursor when a cyclometalated iridium complex is produced by passing through a two-step synthetic route as described above. Obtaining a halogen-crosslinked iridium dimer with a high purity with a favorable yield considerably contributes to commercial viability of a cyclometalated iridium complex to be suitably used as a phosphorescent material for organic EL devices. However, studies by the present inventors show that with the above-mentioned conventional arts, it is difficult to synthesize a halogen-crosslinked iridium dimer with a favorable yield and particularly with a favorable purity.

One of factors regarding the problem of the yield of a halogen-crosslinked iridium dimer is considered to be selection of an iridium compound that is used as a starting material. That is, in many of prior arts related to production of a halogen-crosslinked iridium dimer, iridium trichloride is used as an iridium compound. The present inventors have found that when iridium trichloride is used as an iridium raw material, it is difficult to synthesize a halogen-crosslinked iridium dimer with a favorable yield and particularly with a favorable purity.

For example, the halogen-crosslinked iridium dimer obtained by the method described in Patent Document 2 is a blackish-gray solid. A halogen-crosslinked iridium dimer having 2-(3,5-dimethylphenyl)quinoline is essentially red, and it is evident that the halogen-crosslinked iridium dimer produced in this document contains a large amount of impurities. The impurities are supposed to be unreacted 2-(3,5-dimethylphenyl)quinoline, black decomposed products, and the like, and it is difficult to remove these impurities by purification.

As a raw material for production of a halogen-crosslinked iridium dimer as described above, there may be an iridium compound other than iridium trichloride. For example, Patent Document 3 discloses a process for synthesizing a halogen-crosslinked iridium dimer with bis(acetylacetonato)dichloroiridium (III) acid sodium applied as an iridium compound. In the method described in this document, bis(acetylacetonato)dichloroiridium (III) acid sodium and a ligand having a specific structure shown in Chemical Formula 4 are put in a glass ampoule, and reacted under pressure to synthesize a halogen-crosslinked iridium dimer.

[Chemical Formula 4]

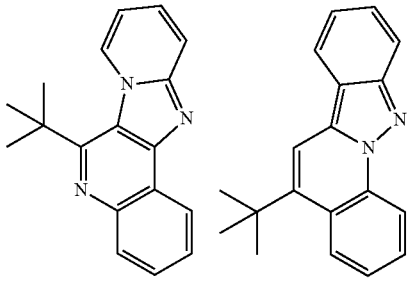

RELATED ART DOCUMENT

Patent Documents

Patent Document 1: JP 2001-345183 A
Patent Document 2: WO 2008/109824 A1
Patent Document 3: WO 2012/007086 A1

BRIEF SUMMARY OF THE INVENTION

Problems to be Solved by the Invention

However, the present inventors have found that even with the method described in Patent Document 3, the yield of a halogen-crosslinked iridium dimer is low, and it is difficult to obtain a compound with a preferred purity. In addition, the method described in this document is a laboratory method in which a reaction is caused to proceed under pressure in a glass ampoule, and the method is far from efficient and practical, and carries a high risk.

The present invention has been made in view of the above-mentioned situations, and discloses a method for producing a halogen-crosslinked iridium dimer with a favorable yield and particularly with a favorable purity, the halogen-crosslinked iridium dimer as a precursor of a cyclometalated iridium complex.

Means for Solving the Problems

For solving the above-described problems, the present inventors have extensively conducted studies, and resultantly found that when a predetermined iridium compound having β-diketonate is used as an iridium compound which is a raw material, and the iridium compound is reacted with an aromatic bidentate ligand under specific reaction conditions, a halogen-crosslinked iridium dimer can be produced with a favorable yield and particularly with a favorable purity, leading to the present invention.

That is, the present invention provides a method for producing a halogen-crosslinked iridium dimer, including reacting an iridium compound represented by the general formula (1) with an aromatic bidentate ligand represented by the general formula (2) in a solvent to produce a halogen-crosslinked iridium dimer represented by the general formula (3), the solvent having a boiling point of 50° C. or higher and lower than 350° C., the aromatic bidentate ligand being added in an amount of 0.5 times or more and less than 10 times the molar amount of the iridium compound, and the reaction being carried out at a reaction temperature of 50° C. or higher and lower than 300° C.

[Chemical Formula 5]

General Formula (1)

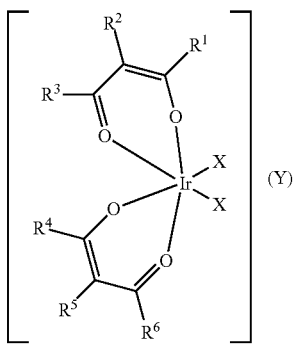

(In the general formula (1), Ir represents an iridium atom, 0 represents an oxygen atom, X represents a halogen atom, and Y represents a counter cation; $R^1$ to $R^6$ each independently represent a hydrogen atom, an alkyl group, or an aryl group, and some or all of hydrogen atoms of the alkyl group or aryl group may be substituted with halogen atoms; and adjacent ones of $R^1$ to $R^6$ may be linked together to form a ring structure.)

[Chemical Formula 6]

General Formula (2)

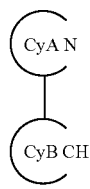

(In the general formula (2), N represents a nitrogen atom, C represents a carbon atom, H represents a hydrogen atom, CyA represents a five-membered or six-membered cyclic group containing nitrogen atoms, CyB represents a five-membered or six-membered cyclic group containing carbon atoms, and CyA and CyB may be linked together to form a ring structure.)

[Chemical Formula 7]

General Formula (3)

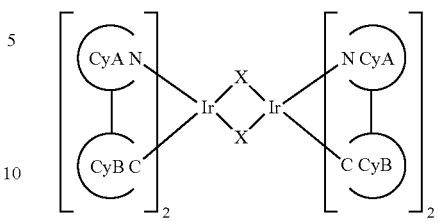

(In the general formula (3), Ir represents an iridium atom, N represents a nitrogen atom, C represents a carbon atom, X represents a halogen atom, CyA represents a five-membered or six-membered cyclic group containing nitrogen atoms, and is linked to iridium via the nitrogen atoms, and CyB represents a five-membered or six-membered cyclic group containing carbon atoms, and is linked to iridium via the carbon atoms; and CyA and CyB may be linked together to further form a ring structure.)

DETAILED DESCRIPTION OF THE INVENTION

As described above, the method for producing a halogen-crosslinked iridium dimer according to the present invention includes reacting an aromatic bidentate ligand of general formula (2) by use of an iridium compound of general formula (1) which has β-diketonate. A predetermined solvent is used, and also the abundance ratio and the reaction temperature of the aromatic bidentate ligand and the iridium compound are each limited within a certain range to synthesize a halogen-crosslinked iridium dimer. The effect of the present invention, i.e. the reason why a halogen-crosslinked iridium dimer can be produced with a high purity and a favorable yield has not been revealed yet, but at the present time, the inventors have the following idea.

When in a halogen-crosslinked iridium dimer production reaction, an iridium compound reacts with an aromatic bidentate ligand, an iridium-carbon bond is formed, and protons are accordingly released. The protons cause a variation in environment of the reaction system such as pH of a reaction solution, and accumulation of the protons may reduce a reaction rate. In the present invention, it is considered that β-diketonate detached from the iridium compound represented by the general formula (1) traps the protons in the reaction solution to form β-diketone, so that the pH of the solution is kept constant. Accordingly, the iridium dimer production reaction can be caused to proceed without affecting the reaction rate. In the case of an iridium halide such as iridium trichloride, which is the conventional art described above, it is supposed that the reaction rate is reduced due to accumulation of protons in the reaction system because there is not a proton trapping effect as described above. In addition, besides the iridium dimer production reaction as a main reduction, an undesired decomposition reaction or the like may proceed. In the present invention, it is thought that because such an impact of protons is eliminated, a halogen-crosslinked iridium dimer can be produced with a favorable yield by suppressing generation of impurities.

In the invention of the present application, the synthetic reaction of the halogen-crosslinked iridium dimer proceeds in a predetermined solvent. In the method in Cited Document 2, the reaction is carried out in the absence of a solvent. A reaction in the absence of a solvent tends to be heterogeneous reaction, so that undesired secondary reactions easily proceed, and therefore the purity of a product is often reduced. In addition, the reaction in the absence of a solvent has low reaction efficiency. In the present invention, a solvent is used, and also reaction conditions are set to produce a halogen-crosslinked iridium dimer.

Hereinafter, the method for producing a halogen-crosslinked iridium dimer according to the present invention will be described in detail. Hereinafter, the details of (I) iridium raw material, (II) aromatic bidentate ligand, and (III) reaction conditions which characterize the present invention will be described.

(I) Iridium Raw Material

As described above, the iridium raw material to be applied in the present invention is an iridium compound represented by the general formula (1). In the general formula (1), Ir represents an iridium atom, and O represents an oxygen atom.

X represents a halogen atom. Specifically, X is preferably a chlorine atom, a bromine atom, or an iodine atom, more preferably a chlorine atom or a bromine atom, especially preferably a chlorine atom.

Y represents a counter cation. The counter cation is not limited as long as it plays a role in forming a salt by setting the overall charge of the iridium compound of general formula (1) to 0. In particular, a monovalent cation is preferable. Specifically, Y is an alkali metal ion, an ammonium ion, a quaternary ammonium ion, a phosphonium ion, a sulfonium ion, an imidazolium ion, a pyridinium ion, a piperidinium ion, a pyrrolidinium, or a proton, preferably an alkali metal ion, an ammonium ion, a quaternary ammonium ion, a phosphonium ion, or a sulfonium ion, more preferably an alkali metal ion, especially preferably a sodium ion or a potassium ion.

The above descriptions of Ir, O, H, X, and Y are also applied to the general formulae (2) to (14).

$R^1$ to $R^6$ in the general formula (1) each independently represent a hydrogen atom, an alkyl group, or an aryl group, and some or all of hydrogen atoms of the alkyl group or aryl group may be substituted with halogen atoms. Adjacent ones of $R^1$ to $R^6$ may be linked together to form a ring structure. When $R^1$ to $R^6$ are alkyl groups or aryl groups, the desired range of these groups is the same as the range of alkyl groups and aryl groups which can be linked to CyA and CyB as described later.

$R^1$, $R^3$, $R^4$, and $R^6$ are each preferably an alkyl group or an aryl group, especially preferably an alkyl group. An alkyl group substituted with a halogen atom (preferably fluorine) is also preferable. Specifically, a methyl group, an isopropyl group, a tert-butyl group, or a trifluoromethyl group is preferable.

$R^2$ and $R^5$ are each preferably a hydrogen atom or an alkyl group, more preferably a hydrogen atom or a methyl group, especially preferably a hydrogen atom.

In addition, $R^1$, $R^3$, $R^4$, and $R^6$ may form a symmetric β-diketone ligand such as one in which $R^1$ is identical to $R^3$ and $R^4$ is identical to $R^6$, or an asymmetric β-diketone ligand such as one in which $R^1$ is not identical to $R^3$ and $R^4$ is not identical to $R^6$. More preferably, $R^1$ and $R^3$ are different substituents, and $R^4$ and $R^6$ are different substituents. That is, more preferably, the iridium compound to be used in the production method of the present invention includes an asymmetric β-diketone ligand. Accordingly, the stability and reactivity of iridium compound are appropriately adjusted, so that synthesis of the halogen-crosslinked iridium dimer favorably proceeds.

The iridium compound that is used in the production method of the present invention, and represented by the general formula (1) has a trans-isomer and a cis-isomer, and one of these isomers may be selectively used, or a mixture of the cis-isomer and the trans-isomer may be used. The iridium compound represented by the general formula (1) has a cis-isomer represented by the general formula (15), and a trans-isomer represented by the general formula (16).

[Chemical Formula 8]

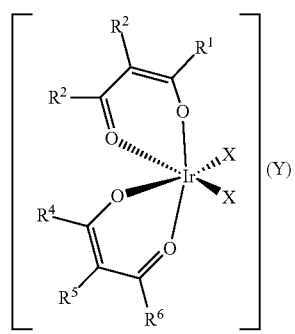

General Formula (15)

[Chemical Formula 9]

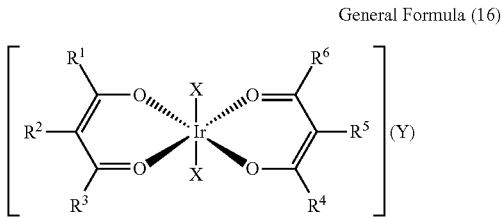

General Formula (16)

(Symbols in the general formulae (15) and (16) have the same meanings as those of the symbols in the general formula (1), and the same applies to a desired range.)

In addition, when the ligand of the iridium compound has an asymmetric structure (i.e. $R^1$ is not identical to $R^3$ and $R^4$ is not identical to $R^6$) as mentioned above, a plurality of geometrical isomers exist. For example, in the case of (Ir-17) in Chemical Formula 11 shown below, the geometrical isomer shown in Chemical Formula 10 is present (where X represents Cl, and Y representing a counter cation is omitted). The iridium compound to be used in the production method of the present invention may be formed by only one of these geometrical isomers, or may be a mixture of two or more of these geometrical isomers. In the purpose of producing a halogen-crosslinked iridium dimer of the present invention, whether or not the iridium compound to be used as a raw material is a mixture of geometrical isomers is not particularly important.

[Chemical Formula 10]

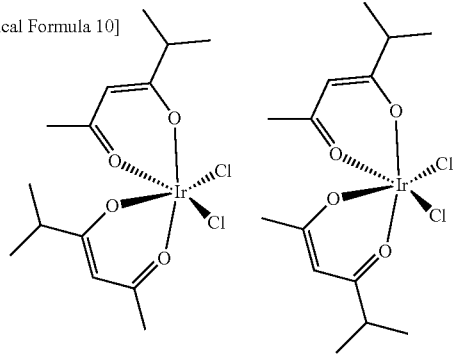

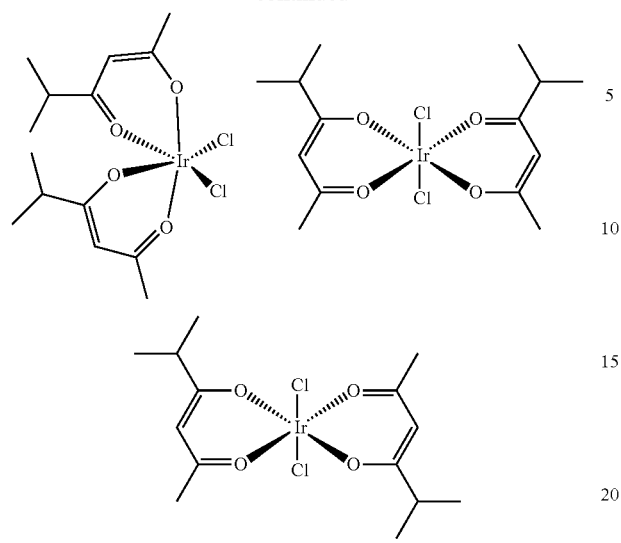
Examples of the iridium compound represented by the general formula (1) are shown in Chemical Formula 11, the iridium compound in the present invention is not limited thereto.
[Chemical Formula 11]
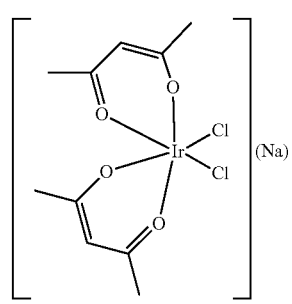
(Ir-1)
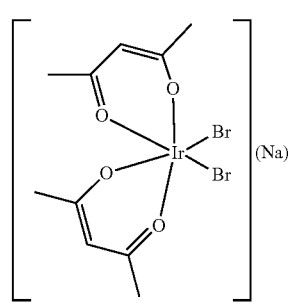
(Ir-2)
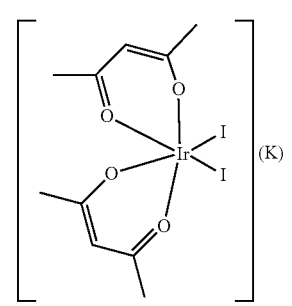
(Ir-3)
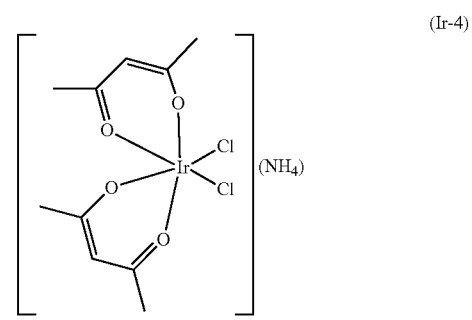
(Ir-4)
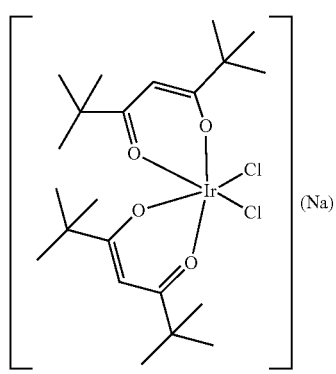
(Ir-5)
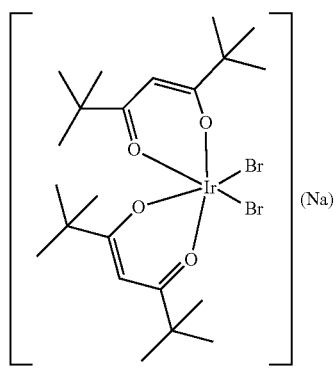
(Ir-6)
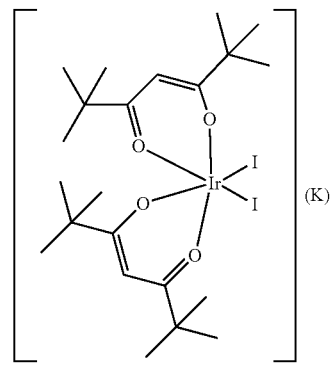
(Ir-7)

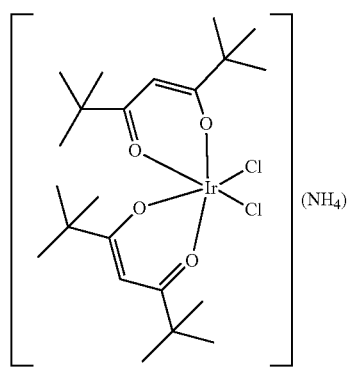
(Ir-8)
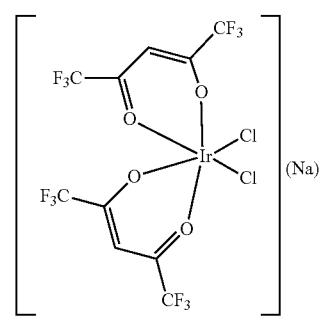
(Ir-9)
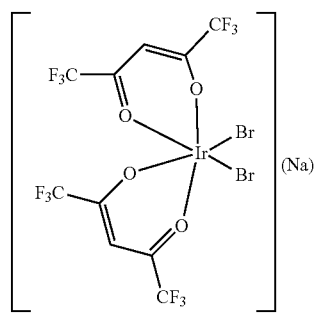
(Ir-10)
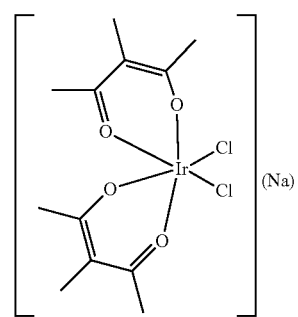
(Ir-11)
(Ir-12)
(Ir-13)
(Ir-14)
(Ir-15)

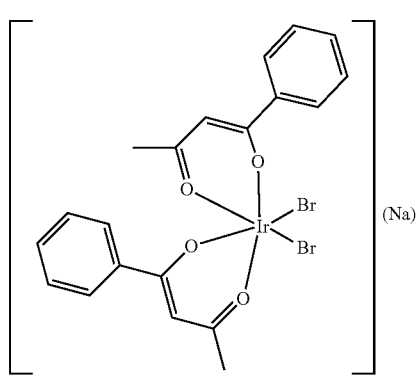
(Ir-16)
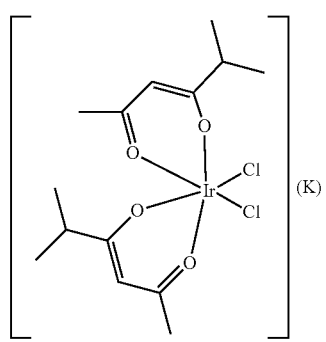
(Ir-17)
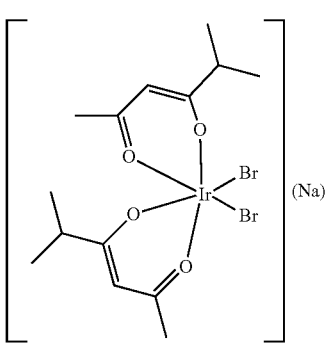
(Ir-18)
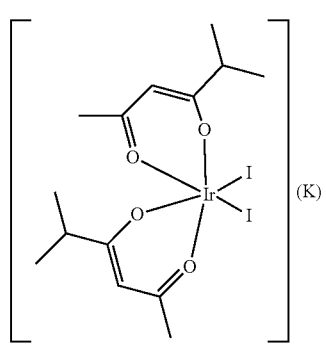
(Ir-19)
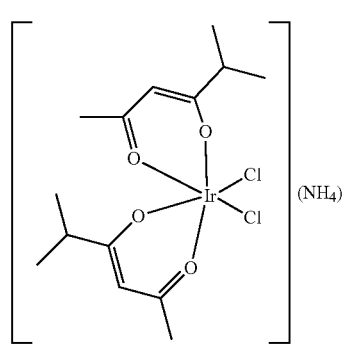
(Ir-20)
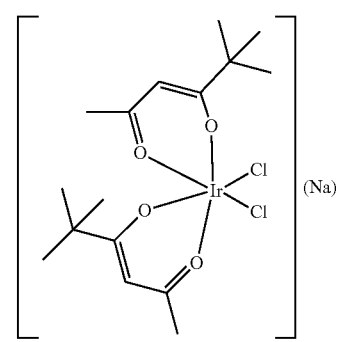
(Ir-21)
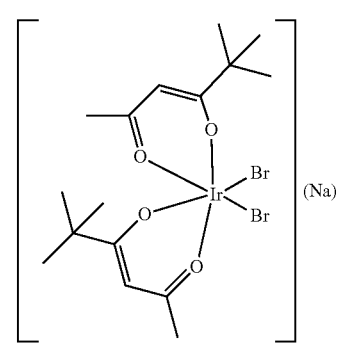
(Ir-22)
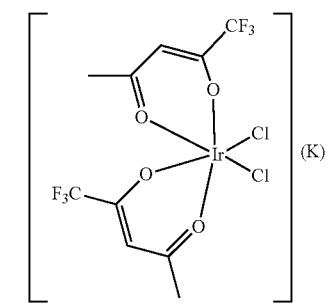
(Ir-23)

-continued

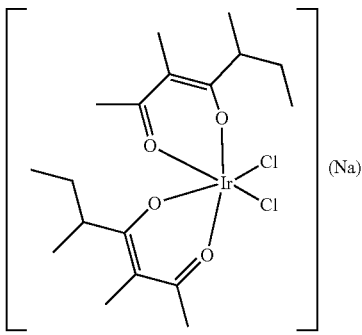

(Ir-24)

(II) Aromatic Bidentate Ligand

The method for producing a halogen-crosslinked iridium dimer according to the present invention includes reacting a raw material including the iridium compound (general formula (1)) described above with an aromatic bidentate ligand of general formula (2).

In the general formula (2) representing the aromatic bidentate ligand in the present invention, N represents a nitrogen atom, C represents a carbon atom, and H represents a hydrogen atom. CyA represents a five-membered or six-membered cyclic group containing nitrogen atoms, and is linked to iridium via the nitrogen atoms. CyA is preferably a five-membered or six-membered nitrogen-containing aromatic heterocyclic ring.

Examples of the five-membered or six-membered cyclic group containing nitrogen atoms include a pyridine ring, a pyrimidine ring, a pyrazine ring, a pyridazine ring, a quinoline ring, an isoquinoline ring, a quinoxaline ring, a cinnoline ring, a phthalazine ring, a quinazoline ring, a naphthyridine ring, an imidazole ring, a pyrazole ring, a triazole ring, a tetrazole ring, an oxazole ring, an oxadiazole ring, a thiazole ring, and a thiadiazole ring. Among them, a pyridine ring, a pyrimidine ring, a quinoline ring, an isoquinoline ring, an imidazole ring, a pyrazole ring, and a triazole ring are preferable, and a pyridine ring, a quinoline ring, an isoquinoline ring, and an imidazole ring are more preferable.

CyA may have substituents, may have adjacent substituents linked together to form a ring structure, and may be further substituted. Specific examples of the substituent include substituents as described later (alkyl group, alkenyl group, alkynyl group, aryl group, amino group, alkoxy group, aryloxy group, heterocyclic oxy group, acyl group, alkoxycarbonyl group, aryloxycarbonyl group, acyloxy group, acylamino group, alkoxycarbonylamino group, aryloxycarbonylamino group, sulfonylamino group, sulfamoyl group, carbamoyl group, alkylthio group, arylthio group, sulfonyl group, sulfinyl group, ureido group, phosphoric amide group, hydroxy group, mercapto group, halogen atoms, cyano group, sulfo group, carboxyl group, nitro group, trifluoromethyl group, hydroxamic acid group, sulfino group, hydrazino group, imino group, heterocyclic group, silyl group, and silyloxy group). The desired range of these substituents is as described above, and the substituents may be further substituted with the above-mentioned substituents.

In addition, CyB in the general formula (2) represents a five-membered or six-membered cyclic group containing carbon atoms, and is linked to iridium via the carbon atoms. CyB is preferably a five-membered or six-membered aromatic carbon ring or aromatic heterocyclic ring, more preferably a five-membered or six-membered aromatic carbon ring or nitrogen-containing aromatic heterocyclic ring, especially preferably a five-membered or six-membered aromatic carbon ring.

Specific examples of the five-membered or six-membered cyclic group containing carbon atoms include a benzene ring, a naphthalene ring, an anthracene ring, a carbazole ring, a fluorene ring, a furan ring, a thiophene ring, a pyridine ring, a pyrimidine ring, a pyrazine ring, a pyridazine ring, a quinoline ring, an isoquinoline ring, a quinoxaline ring, a cinnoline ring, a phthalazine ring, a quinazoline ring, a naphthyridine ring, an imidazole ring, a pyrazole ring, a triazole ring, a tetrazole ring, an oxazole ring, an oxadiazole ring, a thiazole ring, and a thiadiazole ring. A benzene ring, a naphthalene ring, a pyridine ring, and a pyrimidine ring are preferable, a benzene ring, a pyridine ring, and a pyrimidine ring are more preferable, and a benzene ring is especially preferable.

CyB may have substituents, may have adjacent substituents linked together to form a ring structure, and may be further substituted. Specific examples of the substituent include substituents as described later (alkyl group, alkenyl group, alkynyl group, aryl group, amino group, alkoxy group, aryloxy group, heterocyclic oxy group, acyl group, alkoxycarbonyl group, aryloxycarbonyl group, acyloxy group, acylamino group, alkoxycarbonylamino group, aryloxycarbonylamino group, sulfonylamino group, sulfamoyl group, carbamoyl group, alkylthio group, arylthio group, sulfonyl group, sulfinyl group, ureido group, phosphoric amide group, hydroxy group, mercapto group, halogen atoms, cyano group, sulfo group, carboxyl group, nitro group, trifluoromethyl group, hydroxamic acid group, sulfino group, hydrazino group, imino group, heterocyclic group, silyl group, and silyloxy group). The desired range of these substituents is as described above, and the substituents may be further substituted with the above-mentioned substituents.

CyA and CyB may be linked together to form a new ring structure. Here, CyA and CyB are preferably linked together to form a new saturated ring or unsaturated ring, more preferably an unsaturated ring. More specifically, CyA and CyB are preferably linked together to form a benzoquinoxaline ring, a benzoquinoline ring, a dibenzoquinoxaline ring, a dibenzoquinoline ring, or a phenanthridine ring, more preferably a benzoquinoline ring, a dibenzoquinoxaline ring, or a phenanthridine ring. The benzoquinoline ring is preferably a benzo[h]quinoline ring. The dibenzoquinoxaline ring is preferably a dibenzo[f,h]quinoxaline ring. The phenanthridine ring is preferably an imidazo[1,2-f]phenanthridine ring.

The ring formed by linkage of CyA and CyB may have substituents, may have adjacent substituents linked together to further form a ring structure, and may be further substituted. Specific examples of the substituent include substituents as described later (alkyl group, alkenyl group, alkynyl group, aryl group, amino group, alkoxy group, aryloxy group, heterocyclic oxy group, acyl group, alkoxycarbonyl group, aryloxycarbonyl group, acyloxy group, acylamino group, alkoxycarbonylamino group, aryloxycarbonylamino group, sulfonylamino group, sulfamoyl group, carbamoyl group, alkylthio group, arylthio group, sulfonyl group, sulfinyl group, ureido group, phosphoric amide group, hydroxy group, mercapto group, halogen atoms, cyano group, sulfo group, carboxyl group, nitro group, trifluoromethyl group, hydroxamic acid group, sulfino group, hydrazino group, imino group, heterocyclic group, silyl group, and silyloxy group). The desired range of these substituents is as described above, and the substituents may be further substituted with the above-mentioned substituents.

Examples of CyA, CyB, and the substituent which is linked to a ring formed by linkage of CyA and CyB include the following groups.

Alkyl groups (with a carbon number of preferably 1 or more and 30 or less, more preferably 1 or more and 20 or less, especially preferably 1 or more and 10 or less) (e.g. methyl, ethyl, iso-propyl, tert-butyl, n-octyl, n-decyl, n-hexadecyl, cyclopropyl, cyclopentyl, and cyclohexyl).

Alkenyl groups (with a carbon number of preferably 2 or more and 30 or less, more preferably 2 or more and 20 or less, especially preferably 2 or more and 10 or less) (e.g. vinyl, allyl, 2-butenyl, and 3-pentenyl).

Alkynyl groups (with a carbon number of preferably 2 or more and 30 or less, more preferably 2 or more and 20 or less, especially preferably 2 or more and 10 or less) (e.g. propargyl and 3-pentynyl).

Aryl groups (with a carbon number of preferably 6 or more and 30 or less, more preferably 6 or more and 20 or less, especially preferably 6 or more and 12 or less) (e.g. phenyl, p-methylphenyl, naphthyl, and anthranil).

Amino groups (with a carbon number of preferably 0 or more and 30 or less, more preferably 0 or more and 20 or less, especially preferably 0 or more and 10 or less) (e.g. amino, methylamino, dimethylamino, diethylamino, dibenzylamino, diphenylamino, and ditolylamino).

Alkoxy groups (with a carbon number of preferably 1 or more and 30 or less, more preferably 1 or more and 20 or less, especially preferably 1 or more and 10 or less) (e.g. methoxy, ethoxy, butoxy, and 2-ethylhexyloxy).

Aryloxy groups (with a carbon number of preferably 6 or more and 30 or less, more preferably 6 or more and 20 or less, especially preferably 6 or more and 12 or less) (e.g. phenyloxy, 1-naphthyloxy, and 2-naphthyloxy).

Heterocyclic oxy groups (with a carbon number of preferably 1 or more and 30 or less, more preferably 1 or more and 20 or less, especially preferably 1 or more and 12 or less) (e.g. pyridyloxy, pyrazyloxy, pyrimidyloxy, and quinolyloxy).

Acyl groups (with a carbon number of preferably 1 or more and 30 or less, more preferably 1 or more and 20 or less, especially preferably 1 or more and 12 or less) (e.g. acetyl, benzoyl, formyl, and pivaloyl).

Alkoxycarbonyl groups (with a carbon number of 2 or more and 30 or less, more preferably 2 or more and 20 or less, especially preferably 2 or more and 12 or less) (e.g. methoxycarbonyl and ethoxycarbonyl).

Aryloxycarbonyl groups (with a carbon number of preferably 7 or more and 30 or less, more preferably 7 or more and 20 or less, especially preferably 7 or more and 12 or less) (e.g. phenyloxycarbonyl).

Acyloxy groups (with a carbon number of preferably 2 or more and 30 or less, more preferably 2 or more and 20 or less, especially preferably 2 or more and 10 or less) (e.g. acetoxy and benzoyloxy).

Acylamino groups (with a carbon number of preferably 2 or more and 30 or less, more preferably 2 or more and 20 or less, especially preferably 2 or more and 10 or less) (e.g. acetylamino and benzoylamino).

Alkoxycarbonylamino groups (with a carbon number of 2 or more and 30 or less, more preferably 2 or more and 20 or less, especially preferably 2 or more and 12 or less) (e.g. methoxycarbonylamino).

Aryloxycarbonylamino groups (with a carbon number of preferably 7 or more and 30 or less, more preferably 7 or more and 20 or less, especially preferably 7 or more and 12 or less) (e.g. phenyloxycarbonylamino).

Sulfonylamino groups (with a carbon number of preferably 1 or more and 30 or less, more preferably 1 or more and 20 or less, especially preferably 1 or more and 12 or less) (e.g. methanesulfonylamino and benzenesulfonylamino).

Sulfamoyl groups (with a carbon number of preferably 0 or more and 30 or less, more preferably 0 or more and 20 or less, especially preferably 0 or more and 12 or less) (e.g. sulfamoyl, methylsulfamoyl, dimethylsulfamoyl, and phenylsulfamoyl).

Carbamoyl groups (with a carbon number of preferably 1 or more and 30 or less, more preferably 1 or more and 20 or less, especially preferably 1 or more and 12 or less) (e.g. carbamoyl, methylcarbamoyl, diethylcarbamoyl, and phenylcarbamoyl).

Alkylthio groups (with a carbon number of preferably 1 or more and 30 or less, more preferably 1 or more and 20 or less, especially preferably 1 or more and 12 or less) (e.g. methylthio and ethylthio).

Arylthio groups (with a carbon number of preferably 6 or more and 30 or less, more preferably 6 or more and 20 or less, especially preferably 6 or more and 12 or less) (e.g. phenylthio).

Heterocyclic thio groups (with a carbon number of preferably 1 or more and 30 or less, more preferably 1 or more and 20 or less, especially preferably 1 or more and 12 or less) (e.g. pyridylthio, 2-benzimizolylthio, 2-benzoxazolylthio, and 2-benzthiazolylthio).

Sulfonyl groups (with a carbon number of preferably 1 or more and 30 or less, more preferably 1 or more and 20 or less, especially preferably 1 or more and 12 or less) (e.g. mesyl and tosyl).

Sufinyl groups (with a carbon number of preferably 1 or more and 30 or less, more preferably 1 or more and 20 or less, especially preferably 1 or more and 12 or less) (e.g. methanesulfinyl and benzenesulfinyl).

Ureide groups (with a carbon number of preferably 1 or more and 30 or less, more preferably 1 or more and 20 or less, especially preferably 1 or more and 12 or less) (e.g. ureide, methylureide, and phenylureide).

Phosphoramide groups (with a carbon number of preferably 1 or more and 30 or less, more preferably 1 or more and 20 or less, especially preferably 1 or more and 12 or less) (e.g. diethylphosphoramide and phenylphosphoramide).

Hydroxyl groups, mercapto groups, halogen atoms (e.g. fluorine atom, chlorine atom, bromine atom, and iodine atom), cyano groups, sulfo groups, carboxyl groups, nitro groups, trifluoromethyl groups, hydroxamic acid groups, sulfino groups, hydrazino groups, imino groups, and heterocyclic groups (with a carbon number of preferably 1 or more and 30 or less, more preferably 1 or more and 12 or less and with a nitrogen atom, an oxygen atom, or a sulfur atom as a heteroatom) (specifically, imidazolyl, pyridyl, quinolyl, furyl, thienyl, piperidyl, morpholino, benzoxazolyl, benzimidazolyl, benzothiazolyl, carbazolyl group, azepinyl group, and the like).

Silyl groups (with a carbon number of preferably 3 or more and 40 or less, more preferably 3 or more and 30 or less, especially preferably 3 or more and 24 or less) (e.g. trimethylsilyl and triphenylsilyl).

Silyloxy groups (with a carbon number of preferably 3 or more and 40 or less, more preferably 3 or more and 30 or less, especially preferably 3 or more and 24 or less) (e.g. trimethylsilyloxy and triphenylsilyloxy).

Among the above-mentioned substituents, alkyl groups, aryl groups, amino groups, alkoxy groups, aryloxy groups, halogen atoms, cyano groups, trifluoromethyl groups, heterocyclic groups, and silyl groups are preferable, alkyl groups, aryl groups, halogen atoms, cyano groups, and heterocyclic groups are more preferable, and alkyl groups and aryl groups are especially preferable. Among the above-mentioned substituents, those that are desirable are as described above, and these substituents may be further substituted with substituents defined by $R^7$ to $R^{94}$. Adjacent substituents may be linked together to form a ring structure.

As a desired form of the aryl group or heterocyclic group, a dendron (a group having a regular dendritic branched structure with a branch point at an atom or ring) is also preferable. Examples of the dendron include structures described in documents such as WO 02/067343 A1, JP 2003-231692 A, WO 2003/079736 A1, WO 2006/097717 A1, and WO 2016/006523 A1.

Examples of the specific structure of the aromatic heterocyclic bidentate ligand to be used in the present invention include structures represented by the general formulae (4) to (14). Among them, aromatic heterocyclic bidentate ligands having the structures represented by the general formulae (4) to (7) are preferable, and an aromatic heterocyclic bidentate ligand having the structure represented by the general formula (5) is more preferable.

[Chemical Formula 12]

(4)

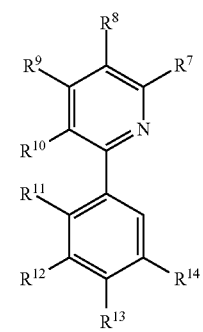

(5)

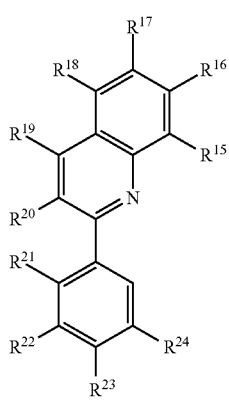

(6)

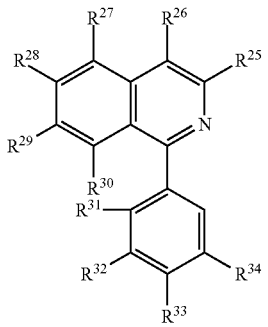

(7)

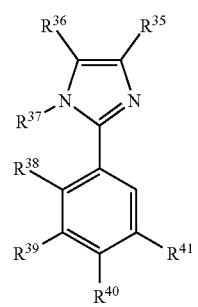

(8)

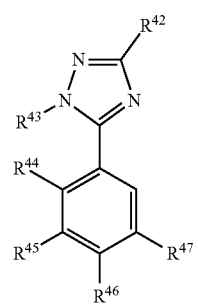

(9)

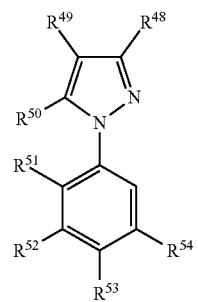

(10)

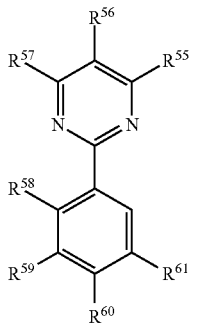

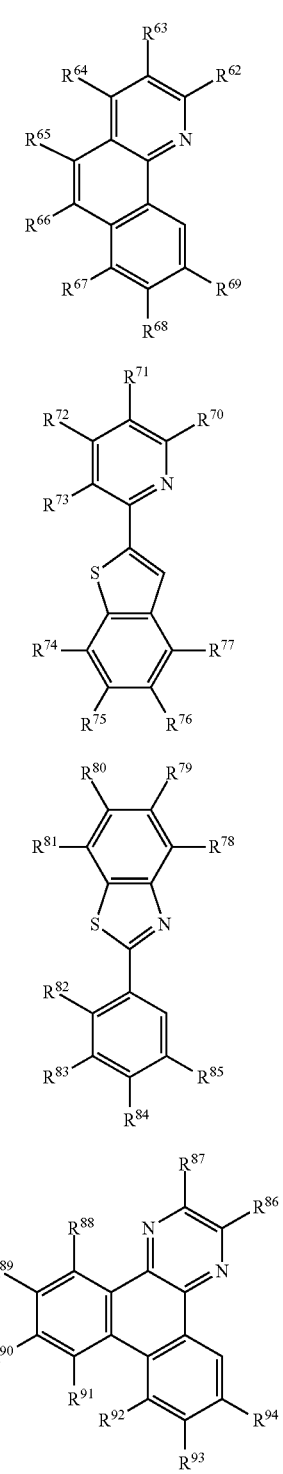

(In the formulae (4) to (14), $R^7$ to $R^{94}$ each independently represent a hydrogen atom or a substituent; and adjacent substituents may be linked together to further form a ring structure.)

In the above formula, $R^7$ to $R^{94}$ each independently represent a hydrogen atom or a substituent. Adjacent substituents may be linked together to further form a ring structure. As substituents $R^7$ to $R^{94}$, the same substituents as those that can be linked to CyA and CyB can be applied, and the same applies to the desired range of various substituents.

(III) Reaction Conditions

In the method for producing a halogen-crosslinked iridium dimer according to the present invention, the iridium compound represented by the general formula (1) and the aromatic bidentate ligand represented by the general formula (2) are reacted with each other in a predetermined solvent under specific conditions.

The solvent to be used in the present invention has a boiling point of 50° C. or higher and lower than 350° C. The boiling point of the solvent is preferably 50° C. or higher and lower than 300° C., more preferably 100° C. or higher and lower than 300° C., especially preferably 150° C. or higher and lower than 250° C., even more preferably 150° C. or higher and lower than 220° C. The boiling point shown here is a value at normal pressure.

The solvent is not particularly limited as long as it has the above-described boiling point, but the solvent is preferably an alcohol, a saturated aliphatic hydrocarbon, an ester, an ether, a nitrile, an aprotic polar solvent, a ketone, an amide, an aromatic hydrocarbon, a nitrogen-containing aromatic compound, an ionic liquid, or water. In particular, the solvent is more preferably an alcohol, a saturated aliphatic hydrocarbon, an ester, an ether, an aprotic polar solvent, or an amide, especially preferably an alcohol or an aprotic polar solvent (DMF, DMSO, or the like), even more preferably an alcohol (with a carbon number of preferably 1 or more and 30 or less, more preferably 1 or more and 20 or less, still more preferably 1 or more and 10 or less). Among alcohols, diol (with a carbon number of preferably 1 or more and 30 or less, more preferably 1 or more and 20 or less, still more preferably 1 or more and 10 or less) is most preferable. Specifically, ethylene glycol, diethylene glycol, triethylene glycol, 1,2-propanediol, 1,3-propanediol, and 1,3-butanediol are preferable.

The above-mentioned solvents may be used singly, or two or more of the solvents may be used in combination.

In production of the halogen-crosslinked iridium dimer according to the present invention, the concentration of the raw material iridium compound (general formula (1)) in the reaction system is not particularly limited. In the present invention, the concentration of the iridium compound is preferably $10^{-4}$ mol/L or more and $10^4$ mol/L or less, more preferably $10^{-3}$ mol/L or more and $10^3$ mol/L or less, still more preferably $10^{-2}$ mol/L or more and $10^2$ mol/L or less, especially preferably $10^{-2}$ mol/L or more and 10 mol/L or less, most preferably $5 \times 10^{-2}$ mol/L or more and 1 mol/L or less.

On the other hand, the use amount of the aromatic bidentate ligand (general formula (2)) should be 0.5 times or more and less than 10 times the molar amount of the iridium compound (general formula (1)).

When the use amount of the aromatic bidentate ligand is above the above-mentioned range, the purity and the yield of the halogen-crosslinked iridium dimer tend to be considerably reduced. Further, when the unreacted aromatic bidentate ligand is mixed with the halogen-crosslinked iridium dimer, it is difficult to remove the aromatic bidentate ligand. Thus, the use amount of the aromatic bidentate ligand is less than 10 times the molar amount of the iridium compound represented by the general formula (1).

In addition, when the use amount of the aromatic bidentate ligand is small, the iridium compound represented by the general formula (1) is easily decomposed, and it is difficult to remove the iridium compound. Thus, the use amount of the aromatic bidentate ligand is not less than 0.5 times the molar amount of the iridium compound.

The use amount of the aromatic bidentate ligand is preferably 0.5 times or more and less than 4 times, more preferably 1 time or more and less than 3 times, still more preferably 1 time or more and less than 2.4 times, especially preferably 1.5 timed or more and less than 2.4 times, most preferably 1.7 times or more and less than 2.2 times the molar amount of the iridium compound represented by the general formula (1).

In production of the halogen-crosslinked iridium dimer according to the present invention, the reaction temperature is 50° C. or higher and lower than 300° C. The reaction temperature is preferably 50° C. or higher and lower than 250° C., more preferably 100° C. or higher and lower than 250° C., still more preferably 150° C. or higher and lower than 250° C., especially preferably 150° C. or higher and lower than 220° C. The heating means here is not particularly limited. Specifically, external heating using an oil bath, a sand bath, a mantle heater, a block heater, or a heat-circulation jacket, as well as heating by irradiation with microwaves can be utilized, for example.

In production of the halogen-crosslinked iridium dimer according to the present invention, the reaction time is not particularly limited as long as the blending ratio and the reaction temperature of the iridium compound and the aromatic bidentate ligand are appropriately set as described above. In the present invention, the reaction time is preferably 0.5 hours or more and less than 72 hours, more preferably 1 hour or more and less than 48 hours, still more preferably 1 hour or more and less than 24 hours, especially preferably 1 hour or more and 10 hours or less.

In addition, the synthetic reaction of the halogen-crosslinked iridium dimer is preferably carried out under an inert gas (e.g. nitrogen or argon) atmosphere.

Preferably, production of the halogen-crosslinked iridium dimer in the present invention is performed at normal pressure (under atmospheric pressure). When the above-described conditions are satisfied, the reaction can be caused to proceed without pressurizing the reaction system. The method disclosed in Patent Document 2 includes pressurization of the reaction system in a glass tube, and is not preferable because there is a risk of rupturing the glass container.

The halogen-crosslinked iridium dimer obtained by the production method described above is treated by a general post-treatment method and then, after purification as necessary or without purification, can be used as a high-purity product. As the method for post-treatment, for example, extraction, cooling, crystallization by adding water or an organic solvent, distillation of the solvent from the reaction mixture, and like operations may be performed alone or in combination. As the method for purification, recrystallization, distillation, sublimation, column chromatography, and the like may be performed alone or in combination.

The halogen-crosslinked iridium dimer obtained in the present invention can be suitably used as a precursor of a bis-cyclometalated iridium complex, or a precursor of a tris-cyclometalated iridium complex.

Advantageous Effects of the Invention

As described above, in the present invention, a high-purity halogen-crosslinked iridium dimer can be produced with a favorable yield under specific conditions by use of an iridium compound represented by the general formula (1). A cyclometalated iridium complex to be used as a phosphorescent material for organic EL devices can be produced with a favorable purity and with a favorable yield by use of the halogen-crosslinked iridium dimer obtained according to the present invention.

DESCRIPTION OF EMBODIMENTS

Hereinafter, an embodiment of the present invention will be described in detail, but the embodiment is illustrative, and the present invention is not limited thereto. In this embodiment, first a halogen-crosslinked iridium dimer was produced by use of an iridium compound ((Ir-1), (Ir-17), or (Ir-23) in Chemical Formula 11) as a raw material (Examples 1 to 21 and Comparative Examples 1 to 5). A cyclometalated iridium complex was synthesized by use of the produced halogen-crosslinked iridium dimer. (Examples 22 and 23 and Comparative Examples 6 and 7)

First, examples and comparative examples for production of the halogen-crosslinked iridium dimer will be described. In the description below, the structures of ligands (L-1 to L-16) and halogen-crosslinked iridium dimers (D-1 to D-17: hereinafter, sometimes referred to as target compounds) are shown in reaction schemes described in examples and comparative examples. The iridium compounds (Ir-1), (Ir-17), and (Ir-23) used in this embodiment were produced by heating and reacting iridium trichloride hydrate and a β-diketone ligand having necessary substituents $R^1$ to $R^6$ in an aqueous solution containing sodium hydrogen carbonate as described below.

[Method for Producing Iridium Compound (Ir-1)]

37.1 g (105 mmol) of iridium trichloride trihydrate and 200 ml of pure water were added in a three-necked flask, and dissolved, 200 ml of 1 M sodium hydrogen carbonate was subsequently added, 20.5 ml (200 mmol) of acetylacetone was further added, and the mixture was reacted at 95° C. for 10 hours. After the reaction, the reaction product was dried by vacuum drying, 400 ml of methanol was subsequently added, and the mixture was refluxed for 8 hours, and filtered. The filtrate was concentrated, and cold methanol was added to obtain 13.0 g of an orange iridium compound (Ir-1) crystal. The isolation yield was 26.8%.

[Method for Producing Iridium Compound (Ir-17)]

40.6 g (115 mmol) of iridium trichloride trihydrate and 530 ml of pure water were added in a three-necked flask, and dissolved, 45.7 g (357 mmol) of 5-methyl-2,4-hexanedione was subsequently added, the mixture was reacted at 95° C. for 1 hour, and 47.5 g (475 mmol) of potassium hydrogen carbonate was added thereto little by little to adjust the pH to about 8. Further, the mixture was heated and reacted for 5 hours. After the reaction, the reaction product was left standing overnight, unreacted 5-methyl-2,4-hexanedione was extracted and removed from the aqueous layer of the supernatant by use of hexane, an iridium compound (Ir-17) was subsequently extracted with ethyl acetate, and the extract was concentrated and dried to obtain 12 g of an orange crude crystal of the iridium compound (Ir-17). Further, the crude crystal was subjected to column purification to obtain 10.2 g of an orange crystal of the iridium compound (Ir-17). The isolation yield was 16%.

[Method for Producing Iridium Compound (Ir-23)]

4.0 g (11.0 mmol) of iridium trichloride trihydrate and 43 ml of pure water were added in a three-necked flask, and stirred in an argon atmosphere, 5.26 g (34.11 mmol) of trifluoroacetylacetone was subsequently added, and the mixture was refluxed in an argon atmosphere for 1 hour. Further, 4.52 g (45.11 mmol) of potassium hydrogen carbonate was added, and the mixture was reacted at 90° C. for 5 hours.

After the reaction, the reaction product was left standing overnight, unreacted trifluoroacetylacetone was extracted and removed from the aqueous layer of the supernatant by use of chloroform, an iridium compound (Ir-23) was subsequently extracted with ethyl acetate, and the extract was concentrated and dried to obtain 1.8 g of a brown crude material of an iridium compound (Ir-23). Further, the crude material was subjected to column purification to obtain 1.5 g of an orange solid of the iridium compound (Ir-23). The isolation yield was 20%.

<Example 1> Synthesis of Compound (D-1)

[Chemical Formula 13]

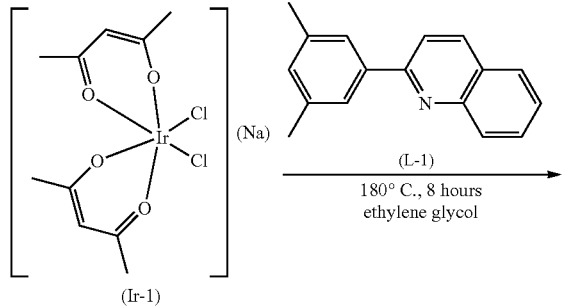

(Ir-1)

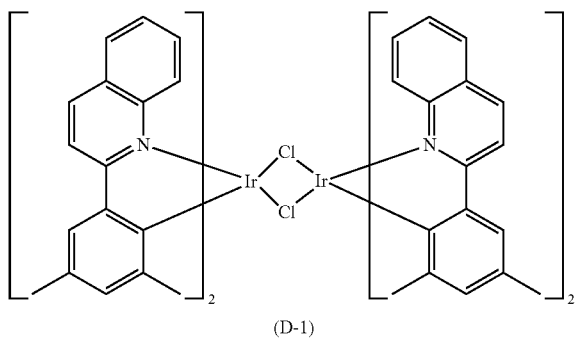

(D-1)

290.6 mg of an iridium compound (Ir-1), 280.0 mg of a ligand (L-1), and 5 ml of ethylene glycol were added in a three-necked flask, and heated and reacted in an argon atmosphere at 180° C. for 8 hours. After completion of the reaction, the reaction solution was cooled to room temperature, dichloromethane and water were added, the mixture was extracted, and the organic layer was recovered. The solution was filtered through a celite layer, and the filtrate was concentrated under reduced pressure. The obtained solid was recrystallized by use of dichloromethane and hexane to obtain a target compound (D-1) as a red solid. The isolation yield was 62%. The product was analyzed by $^1$H-NMR.

<Example 2> Synthesis of Compound (D-1)

[Chemical Formula 14]

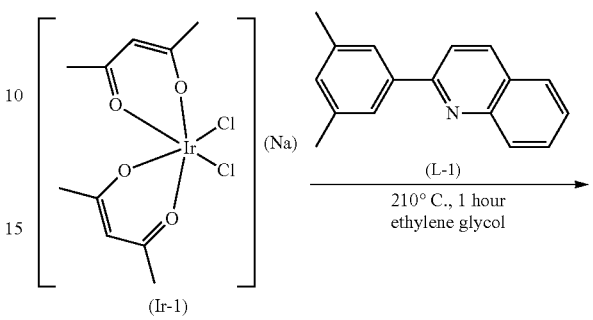

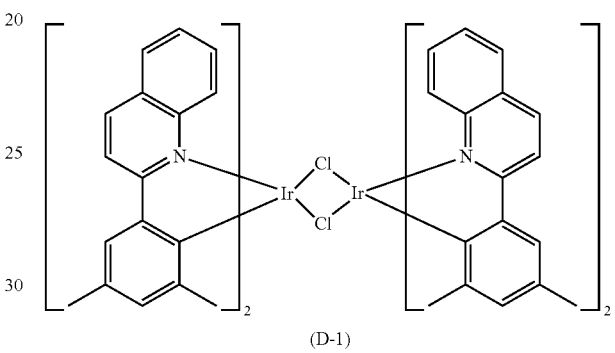

(D-1)

290.6 mg of an iridium compound (Ir-1), 280.0 mg of a ligand (L-1), and 2.5 ml of ethylene glycol were added in a three-necked flask, and heated and reacted in an argon atmosphere at 210° C. for 1 hour. After completion of the reaction, the reaction solution was cooled to room temperature, dichloromethane and water were added, the mixture was extracted, and the organic layer was recovered. The solution was filtered through a celite layer, and the filtrate was concentrated under reduced pressure. The obtained solid was recrystallized by use of dichloromethane and hexane to obtain a target compound (D-1) as a red solid. The isolation yield was 85%. The product was analyzed by $^1$H-NMR.

<Comparative Example 1> Synthesis of Compound (D-1) (Using Iridium Trichloride n-Hydrate as Starting Material)

[Chemical Formula 15]

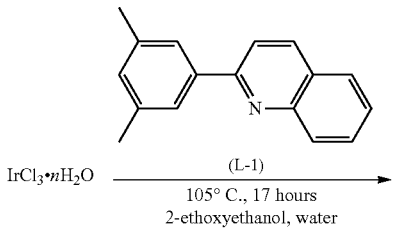

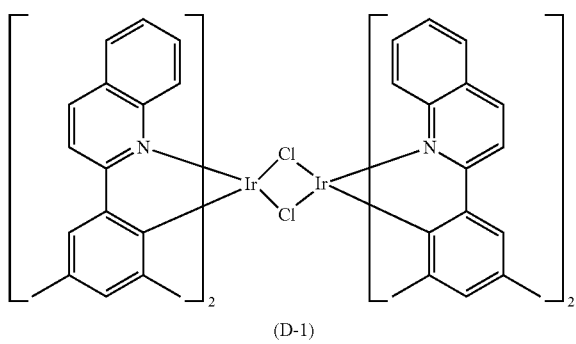

(D-1)

211.6 mg of iridium trichloride n-hydrate, 320.5 mg of a ligand (L-1), 17 ml of 2-ethoxyethanol, and 2 ml of water were added in a three-necked flask, and heated and reacted in an argon atmosphere at 105° C. for 17 hours. After completion of the reaction, the reaction solution was cooled to room temperature, and concentrated to about 5 ml. Water was added to the solution to precipitate a solid. This mixture was filtered, and washed with water and hexane to obtain 360.4 mg of a blackish ocher solid. The blackish ocher solid was analyzed by ¹H-NMR, and the result showed that in addition to a target compound (D-1), a ligand (L-1) and unidentified impurities were contained in a large amount, and the purity of the target compound was about 50%.

<Comparative Example 2> Synthesis of Compound (D-1) (without Using Solvent)

[Chemical Formula 16]

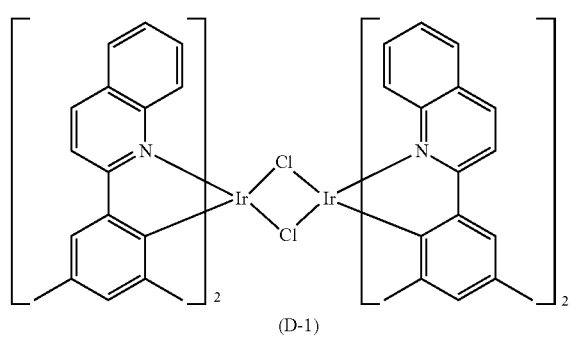

(D-1)

290.6 mg of an iridium compound (Ir-1) and 1.4 g of a ligand (L-1) were added in a three-necked flask, and heated and reacted in an argon atmosphere at 210° C. for 1 hour. After completion of the reaction, the reaction solution was cooled to room temperature, dichloromethane and water were added, the mixture was extracted, and the organic layer was recovered. The solution was filtered through a celite layer, and the filtrate was concentrated under reduced pressure. The obtained solid was recrystallized by use of dichloromethane and hexane to obtain a target compound (D-1) as a red solid. The isolation yield was 40%. The product was analyzed by ¹H-NMR.

<Example 3> Synthesis of Compound (D-2)

[Chemical Formula 17]

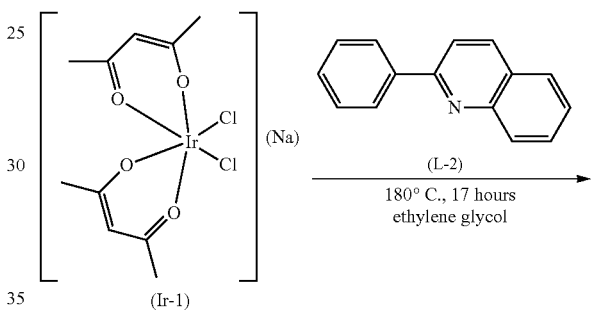

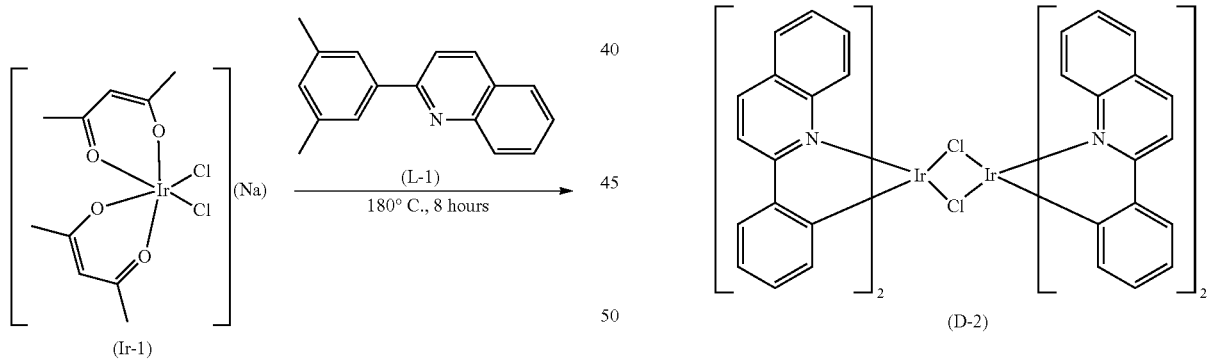

(D-2)

290.6 mg of an iridium compound (Ir-1), 246.4 mg of a ligand (L-2), and 5 ml of ethylene glycol were added in a three-necked flask, and heated and reacted in an argon atmosphere at 180° C. for 17 hours. After completion of the reaction, the reaction solution was cooled to room temperature, dichloromethane and water were added, the mixture was extracted, and the organic layer was recovered. The solution was filtered through a celite layer, and the filtrate was concentrated under reduced pressure. The obtained solid was recrystallized by use of dichloromethane and hexane to obtain a target compound (D-2) as a red solid. The isolation yield was 79%. The product was analyzed by ¹H-NMR.

<Comparative Example 3> Synthesis of Compound (D-2) (Using Iridium Trichloride n-Hydrate as Starting Material)

[Chemical Formula 18]

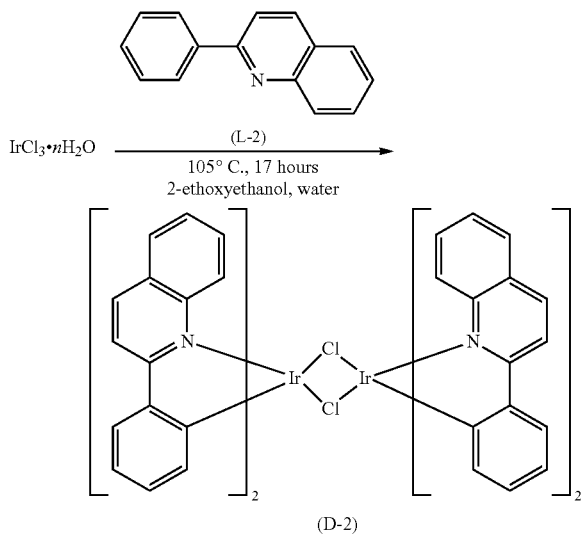

(D-2)

211.6 mg of iridium trichloride n-hydrate, 271.0 mg of a ligand (L-2), 17 ml of 2-ethoxyethanol, and 2 ml of water were added in a three-necked flask, and heated and reacted in an argon atmosphere at 105° C. for 17 hours. After completion of the reaction, the reaction solution was cooled to room temperature, and concentrated to about 5 ml. Water was added to the solution to precipitate a solid. This mixture was filtered, and washed with water and hexane to obtain 351.9 mg of a blackish red solid. The blackish red solid was analyzed by $^1$H-NMR, and the result showed that in addition to a target compound (D-2), a ligand (L-2) and unidentified impurities were contained in a large amount, and the purity of the target compound was about 50%.

<Example 4> Synthesis of Compound (D-3)

[Chemical Formula 19]

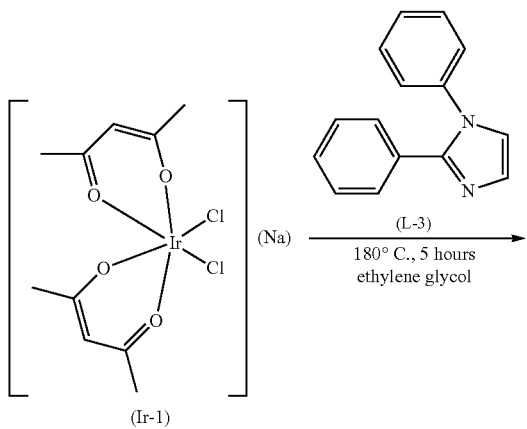

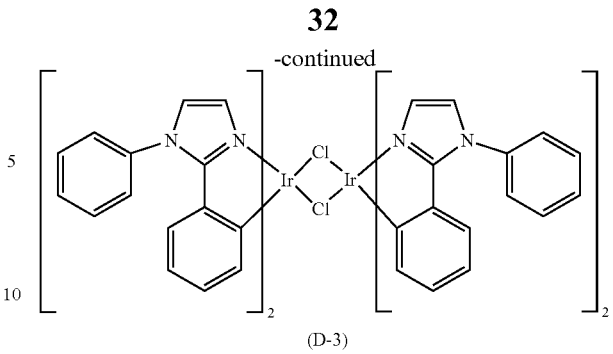

(D-3)

290.6 mg of an iridium compound (Ir-1), 264.0 mg of a ligand (L-3), and 5 ml of ethylene glycol were added in a three-necked flask, and heated and reacted in an argon atmosphere at 180° C. for 5 hours. After completion of the reaction, the yellow reaction solution was cooled to room temperature, and filtered. The obtained light yellow solid was washed with methanol to obtain a target compound (D-3) with an isolation yield of 73%. The product was analyzed by $^1$H-NMR.

<Comparative Example 4> Synthesis of Compound (D-3) (Using Iridium Trichloride n-Hydrate as Starting Material)

[Chemical Formula 20]

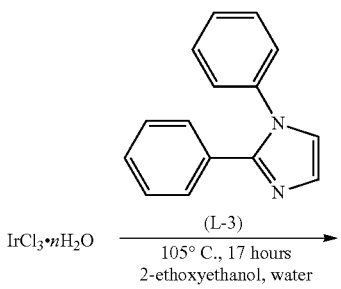

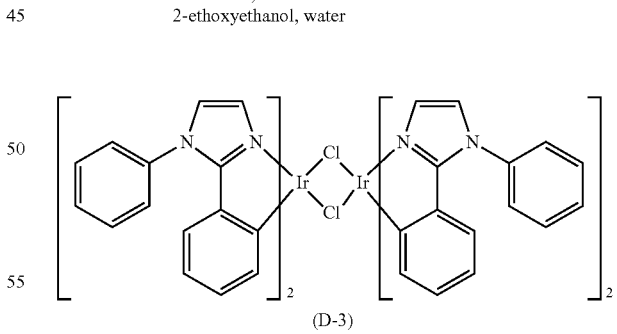

(D-3)

211.6 mg of iridium trichloride n-hydrate, 396.4 mg of a ligand (L-3), 10 ml of 2-ethoxyethanol, and 3 ml of water were added in a three-necked flask, and heated and reacted in an argon atmosphere at 105° C. for 17 hours. After completion of the reaction, the brown reaction solution was cooled to room temperature, and filtered. The obtained dark yellow solid was washed with methanol to obtain a target compound (D-3) with an isolation yield of 30%.

<Example 5> Synthesis of Compound (D-4)

[Chemical Formula 21]

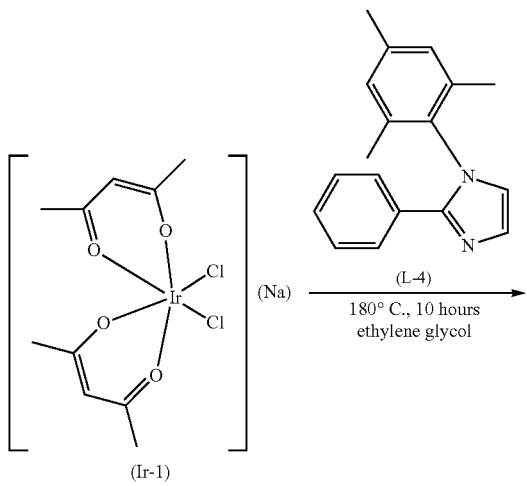

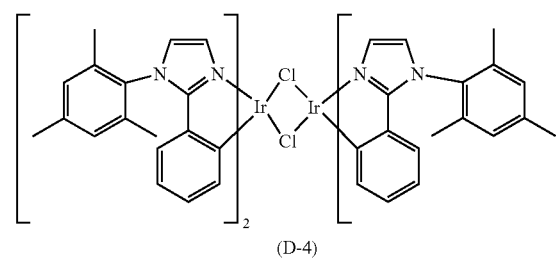

290.6 mg of an iridium compound (Ir-1), 314.8 mg of a ligand (L-4), and 5 ml of ethylene glycol were added in a three-necked flask, and heated and reacted in an argon atmosphere at 180° C. for 10 hours. After completion of the reaction, the yellow reaction solution was filtered to obtain a light yellow solid. The light yellow solid was washed with methanol to obtain a target compound (D-4) with an isolation yield of 73%. The product was analyzed by $^1$H-NMR.

<Example 6> Synthesis of Compound (D-5)

[Chemical Formula 22]

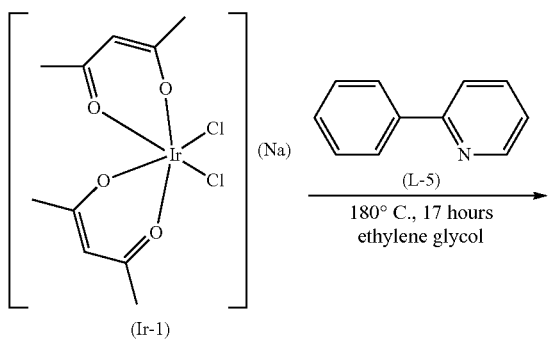

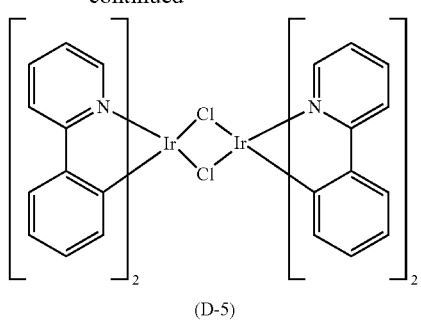

290.6 mg of an iridium compound (Ir-1), 186.0 mg of a ligand (L-5), and 5 ml of ethylene glycol were added in a three-necked flask, and heated and reacted in an argon atmosphere at 180° C. for 17 hours. After completion of the reaction, the yellow reaction solution was filtered to obtain a light yellow solid. The light yellow solid was washed with methanol to obtain a target compound (D-5) with an isolation yield of 97%. The product was analyzed by $^1$H-NMR.

<Example 7> Synthesis of Compound (D-5)

[Chemical Formula 23]

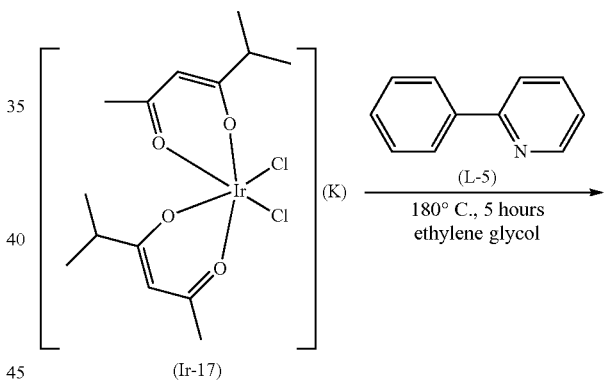

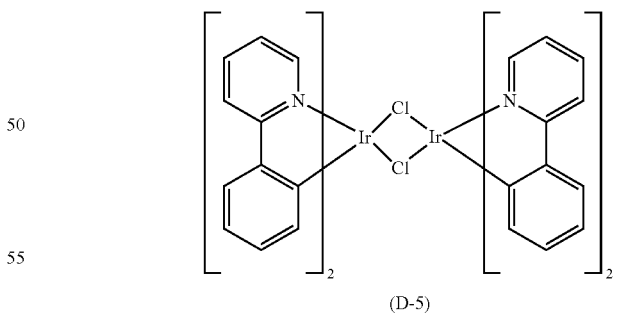

333.9 mg of an iridium compound (Ir-17), 186.0 mg of a ligand (L-5), and 5 ml of ethylene glycol were added in a three-necked flask, and heated and reacted in an argon atmosphere at 180° C. for 5 hours. After completion of the reaction, the yellow reaction solution was filtered to obtain a light yellow solid. The light yellow solid was washed with methanol to obtain a target compound (D-5) with an isolation yield of 92%. The product was analyzed by $^1$H-NMR.

\<Example 8\> Synthesis of Compound (D-5)

[Chemical Formula 24]

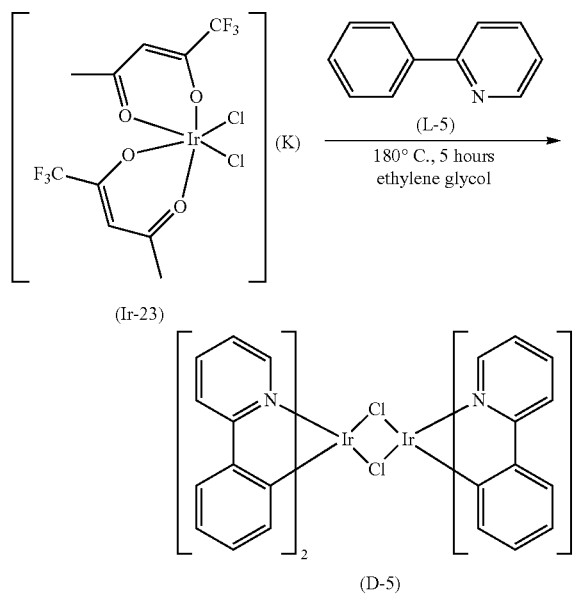

182.5 mg of an iridium compound (Ir-23), 93.0 mg of a ligand (L-5), and 2.5 ml of ethylene glycol were added in a three-necked flask, and heated and reacted in an argon atmosphere at 180° C. for 5 hours. After completion of the reaction, the yellow reaction solution was filtered to obtain a light yellow solid. The light yellow solid was washed with methanol to obtain a target compound (D-5) with an isolation yield of 97%. The product was analyzed by $^1$H-NMR.

\<Comparative Example 5\> Synthesis of Compound (D-5) (without Using Solvent)

[Chemical Formula 25]

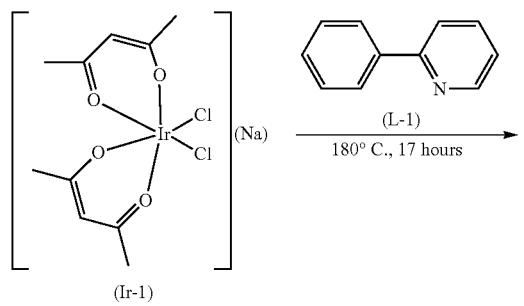

333.9 mg of an iridium compound (Ir-17) and 223.2 mg of a ligand (L-5) were added in a Schlenk flask, and heated and reacted in an argon atmosphere at 180° C. for 17 hours. After completion of the reaction, methanol was added, and the yellow reaction solution was filtered to obtain a smoky yellow solid. The smoky yellow solid was washed with methanol to obtain a target compound (D-5) with a yield of 18%.

\<Example 9\> Synthesis of Compound (D-6)

[Chemical Formula 26]

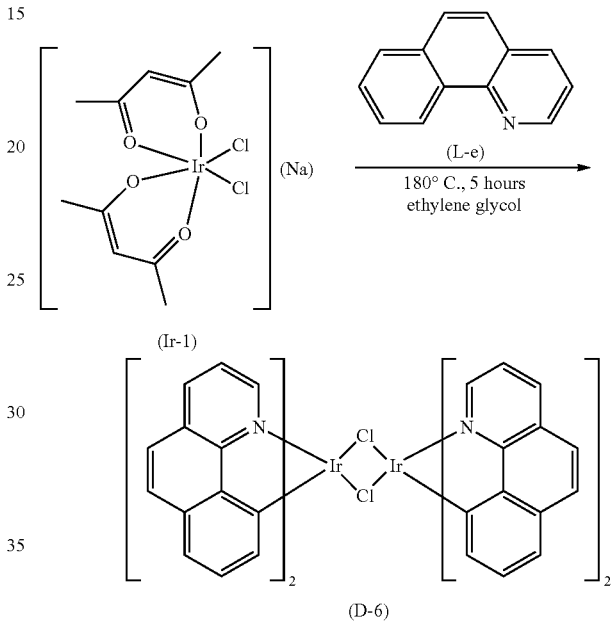

290.6 mg of an iridium compound (Ir-1), 215.1 mg of a ligand (L-6), and 5 ml of ethylene glycol were added in a three-necked flask, and heated and reacted in an argon atmosphere at 180° C. for 5 hours. After completion of the reaction, the yellow reaction solution was filtered to obtain a yellow solid. The yellow solid was washed with methanol to obtain a target compound (D-6) with an isolation yield of 91%. The product was analyzed by $^1$H-NMR.

\<Example 10\> Synthesis of Compound (D-7)

[Chemical Formula 27]

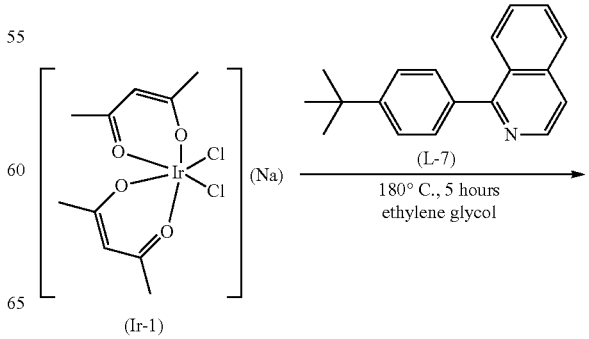

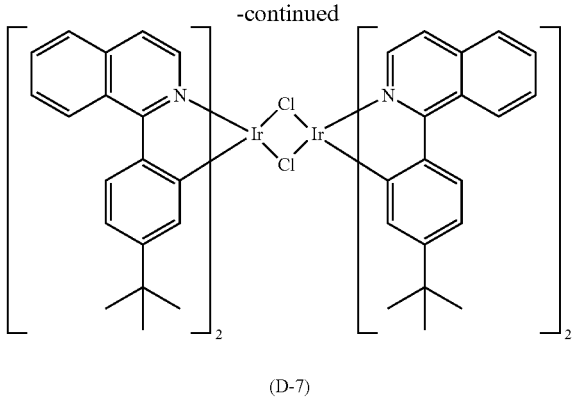

(D-7)

290.6 mg of an iridium compound (Ir-1), 313.6 mg of a ligand (L-7), and 5 ml of ethylene glycol were added in a three-necked flask, and heated and reacted in an argon atmosphere at 180° C. for 5 hours. After completion of the reaction, the red reaction solution was filtered to obtain a red solid. The red solid was washed with methanol to obtain a target compound (D-7) with an isolation yield of 92%. The product was analyzed by $^1$H-NMR.

<Example 11> Synthesis of Compound (D-8)

[Chemical Formula 28]

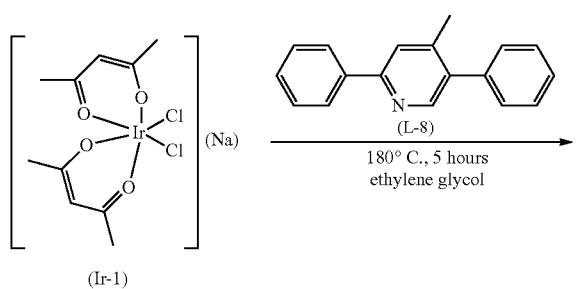

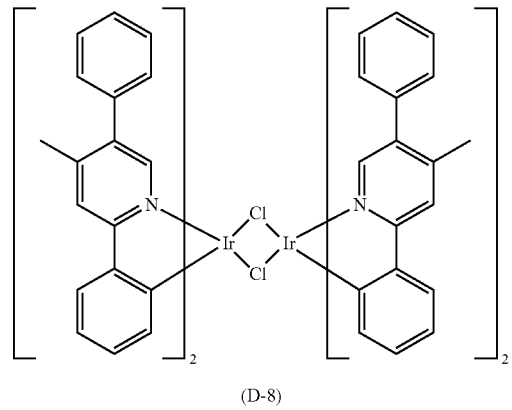

(D-8)

290.6 mg of an iridium compound (Ir-1), 294.4 mg of a ligand (L-8), and 5 ml of ethylene glycol were added in a three-necked flask, and heated and reacted in an argon atmosphere at 180° C. for 5 hours. After completion of the reaction, the yellow reaction solution was filtered to obtain a yellow solid. The yellow solid was washed with methanol to obtain a target compound (D-8) with an isolation yield of 97%. The product was analyzed by $^1$H-NMR.

<Example 12> Synthesis of Compound (D-9)

[Chemical Formula 29]

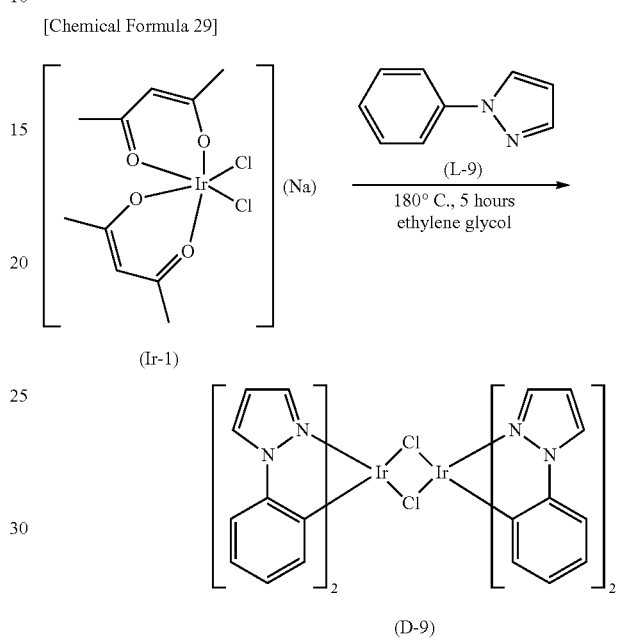

(D-9)

290.6 mg of an iridium compound (Ir-1), 173.0 mg of a ligand (L-9), and 5 ml of ethylene glycol were added in a three-necked flask, and heated and reacted in an argon atmosphere at 180° C. for 5 hours. After completion of the reaction, the light yellow reaction solution was filtered to obtain a light yellow solid. The light yellow solid was washed with methanol to obtain a target compound (D-9) with an isolation yield of 83%. The product was analyzed by $^1$H-NMR.

<Example 13> Synthesis of Compound (D-9)

[Chemical Formula 30]

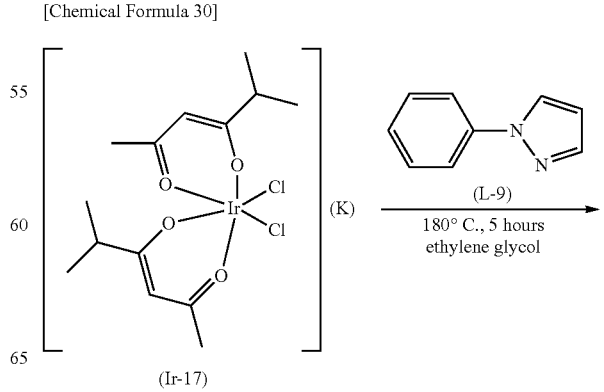

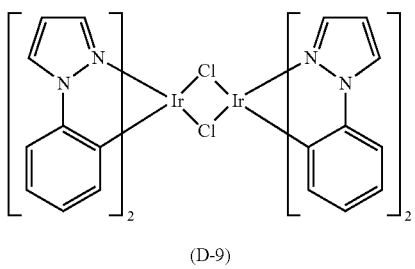

(D-9)

333.9 mg of an iridium compound (Ir-17), 173.0 mg of a ligand (L-9), and 5 ml of ethylene glycol were added in a three-necked flask, and heated and reacted in an argon atmosphere at 180° C. for 5 hours. After completion of the reaction, the light yellow reaction solution was filtered to obtain a light yellow solid. The light yellow solid was washed with methanol to obtain a target compound (D-9) with an isolation yield of 92%. The product was analyzed by $^1$H-NMR.

<Example 14> Synthesis of Compound (D-10)

[Chemical Formula 31]

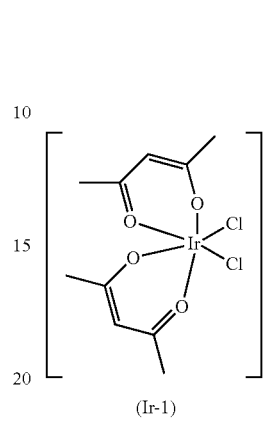

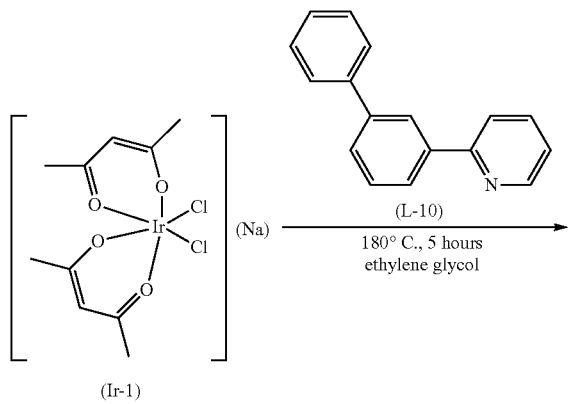

(D-10)

290.6 mg of an iridium compound (Ir-1), 277.6 mg of a ligand (L-10), and 5 ml of diethylene glycol were added in a three-necked flask, and heated and reacted in an argon atmosphere at 180° C. for 5 hours. After completion of the reaction, the yellow reaction solution was filtered to obtain a yellow solid. The yellow solid was washed with methanol to obtain a target compound (D-10) with an isolation yield of 87%. The product was analyzed by $^1$H-NMR.

<Example 15> Synthesis of Compound (D-11)

[Chemical Formula 32]

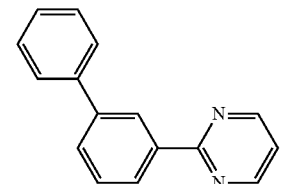

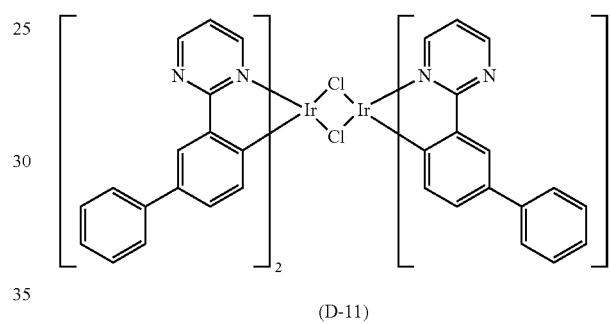

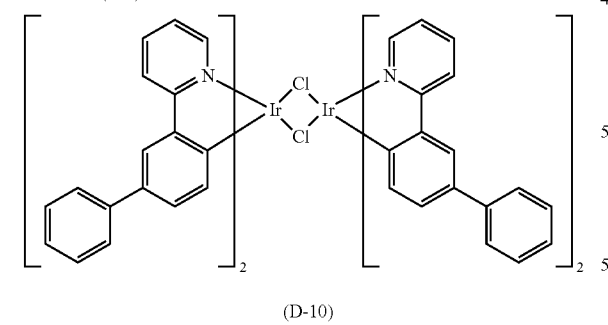

(D-11)

290.6 mg of an iridium compound (Ir-1), 278.7 mg of a ligand (L-11), and 5 ml of ethylene glycol were added in a three-necked flask, and heated and reacted in an argon atmosphere at 180° C. for 5 hours. After completion of the reaction, the yellow reaction solution was filtered to obtain a yellow solid. The yellow solid was washed with methanol to obtain a compound (D-11) with an isolation yield of 90%. The product was analyzed by $^1$H-NMR.

<Example 16> Synthesis of Compound (D-12)

[Chemical Formula 33]

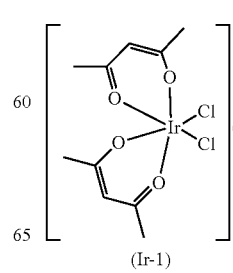
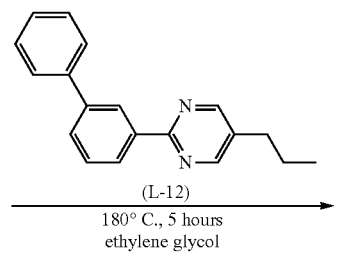

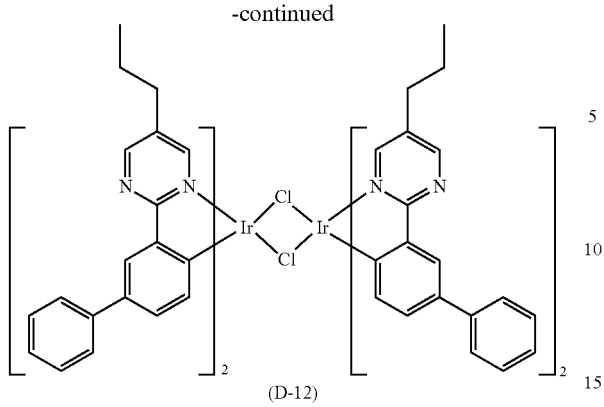

(D-12)

290.6 mg of an iridium compound (Ir-1), 329.1 mg of a ligand (L-12), and 5 ml of ethylene glycol were added in a three-necked flask, and heated and reacted in an argon atmosphere at 180° C. for 5 hours. After completion of the reaction, the yellow reaction solution was filtered to obtain a yellow solid. The yellow solid was washed with methanol to obtain a target compound (D-12) with an isolation yield of 93%. The product was analyzed by $^1$H-NMR.

<Example 17> Synthesis of Compound (D-13)

[Chemical Formula 34]

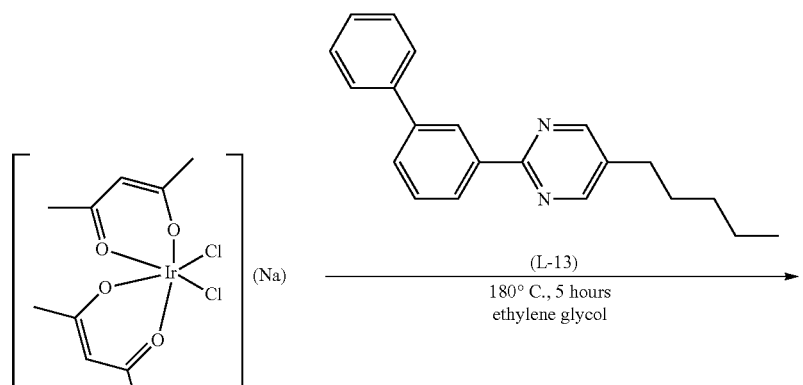

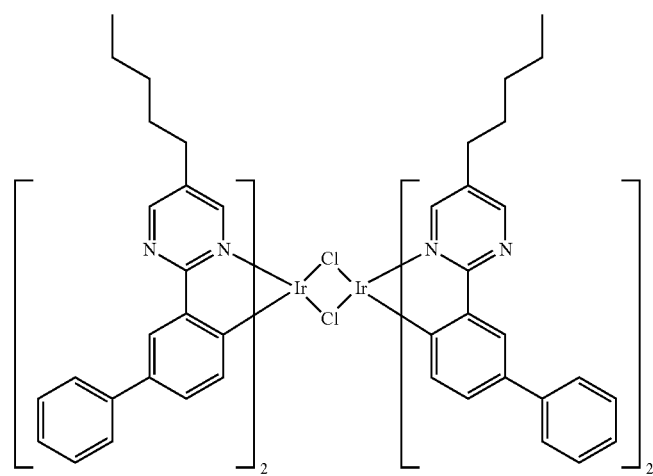

(D-13)

290.6 mg of an iridium compound (Ir-1), 361.7 mg of a ligand (L-13), and 5 ml of ethylene glycol were added in a three-necked flask, and heated and reacted in an argon atmosphere at 180° C. for 5 hours. After completion of the reaction, the reaction solution was cooled to room temperature, dichloromethane and water were added, and the mixture was extracted. The organic layer was recovered, and concentrated under reduced pressure. The obtained yellow solid was recrystallized by use of dichloromethane and hexane to obtain a target compound (D-13) with an isolation yield of 80%. The product was analyzed by $^1$H-NMR.

<Example 18> Synthesis of Compound (D-14)

[Chemical Formula 35]

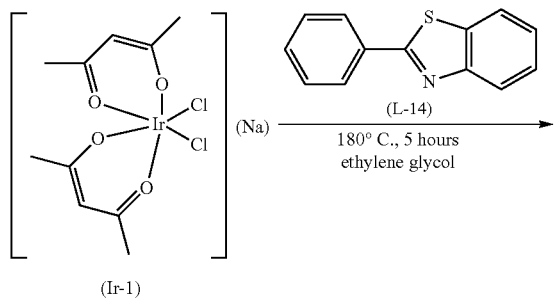

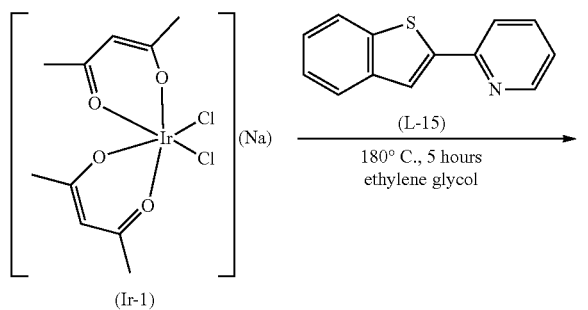

(D-14)

290.6 mg of an iridium compound (Ir-1), 253.5 mg of a ligand (L-14), and 5 ml of ethylene glycol were added in a three-necked flask, and heated and reacted in an argon atmosphere at 180° C. for 5 hours. After completion of the reaction, the yellow reaction solution was filtered to obtain a yellow solid. The yellow solid was washed with methanol to obtain a target compound (D-14) with an isolation yield of 73%. The product was analyzed by $^1$H-NMR.

<Example 19> Synthesis of Compound (D-15)

[Chemical Formula 36]

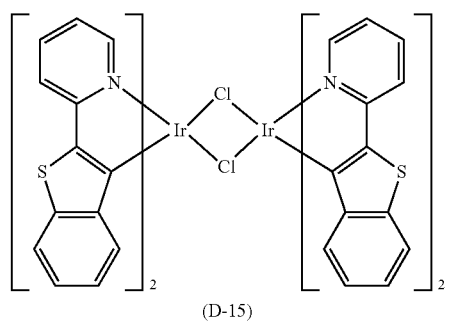

(D-15)

290.6 mg of an iridium compound (Ir-1), 253.5 mg of a ligand (L-15), and 5 ml of ethylene glycol were added in a three-necked flask, and heated and reacted in an argon atmosphere at 180° C. for 5 hours. After completion of the reaction, the reddish brown reaction solution was filtered to obtain a reddish brown solid. The reddish brown solid was washed with methanol to obtain a target compound (D-15) with an isolation yield of 87%. The product was analyzed by $^1$H-NMR.

<Example 20> Synthesis of Compound (D-16)

[Chemical Formula 37]

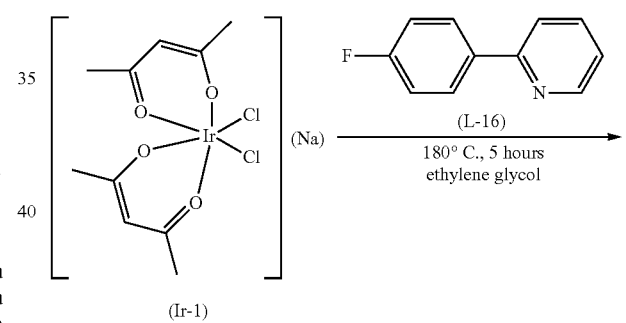

(D-16)

290.6 mg of an iridium compound (Ir-1), 207.8 mg of a ligand (L-16), and 5 ml of ethylene glycol were added in a three-necked flask, and heated and reacted in an argon atmosphere at 180° C. for 5 hours. After completion of the reaction, the yellow reaction solution was filtered to obtain a light yellow solid. The yellow solid was washed with methanol to obtain a target compound (D-16) with an isolation yield of 90%. The product was analyzed by $^1$H-NMR.

45

<Example 21> Synthesis of Compound (D-17)

[Chemical Formula 38]

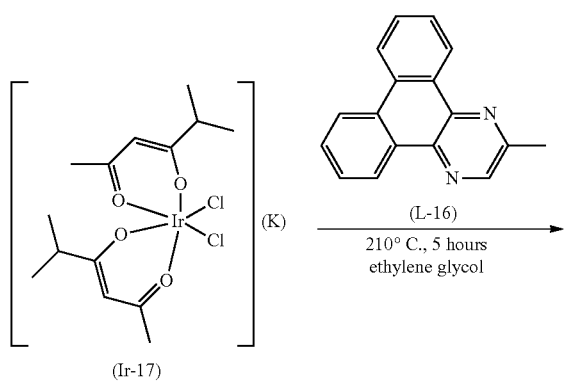

(Ir-17)

(D-16)

333.9 mg of an iridium compound (Ir-17), 292.8 mg of a ligand (L-17), and 5 ml of diethylene glycol were added in a three-necked flask, and heated and reacted in an argon atmosphere at 210° C. for 5 hours. After completion of the reaction, the light yellow reaction solution was filtered to obtain a light yellow solid. The light yellow solid was washed with methanol, and then recrystallized with dichloromethane and methanol to obtain a target compound (D-17) with an isolation yield of 61%. The product was analyzed by $^1$H-NMR.

The results of Examples 1 to 21 revealed that it was possible to produce a halogen-crosslinked iridium dimer with a favorable yield by using the production method of the present invention. On the other hand, it was apparent from Comparative Examples 1, 3, and 4 that when iridium chloride was used as a starting material, it was not possible to produce a halogen-crosslinked iridium dimer with a favorable yield. Comparative Examples 2 and 5 revealed that the yield of a halogen-crosslinked iridium dimer synthesized in the absence of a solvent was lower as compared to a case where the reaction was carried out in a solvent.

The results of Examples 7, 13, and 21 show that the iridium compound (Ir-17) as a raw material is an iridium compound, the ligand of which has substituents satisfying the relationship of $R^1 \neq R^3$ and $R^4 \neq R^6$. A favorable yield is also obtained from this iridium compound. In addition, the result of Example 8 showed that an alkyl group substituted with fluorine as a substituent was also useful.

46

Next, a cyclometalated iridium complex (C-1 or C-2) was synthesized from the halogen-crosslinked iridium dimer obtained by the production method in each of examples and comparative examples.

<Example 22> Synthesis of Cyclometalated Iridium Complex (C-1)

[Chemcial Formula 39]

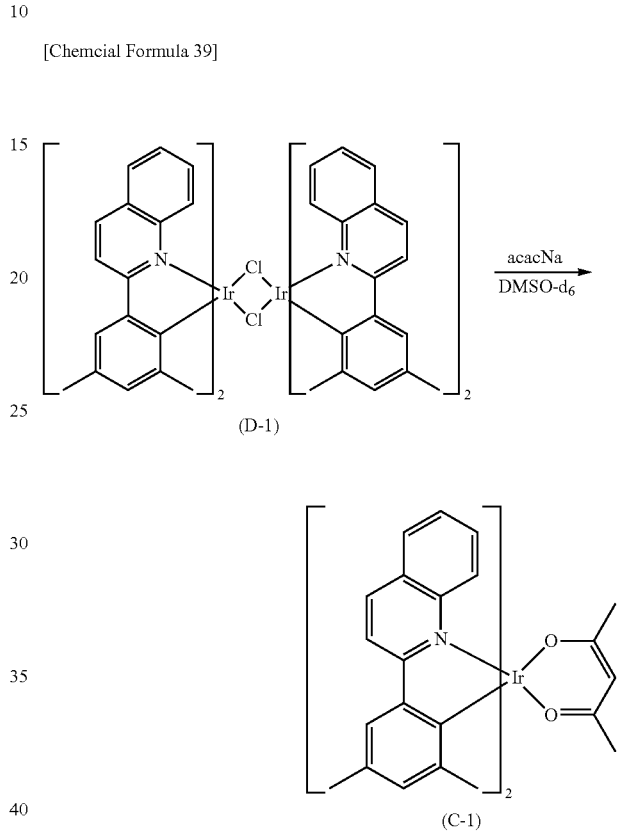

(D-1)

(C-1)

6.0 mg of the chlorine-crosslinked iridium dimer (D-1) obtained in Example 2, and 6.0 mg of sodium acetylacetonate hydrate were dissolved in DMSO-$d_6$ (0.75 ml) by heating, and the solution was then added in a NMR tube. The reaction solution was analyzed by $^1$H-NMR, and the result showed that the chlorine-crosslinked iridium dimer (D-1) completely disappeared, and a cyclometalated iridium complex (C-1) was quantitatively produced. This revealed that the chlorine-crosslinked iridium dimer (D-1) obtained in Example 2 had an extremely high purity.

<Comparative Example 6> Synthesis of Cyclometalated Iridium Complex (C-1)

6.0 mg of the chlorine-crosslinked iridium dimer (D-1) obtained in Comparative Example 1, and 6.0 mg of acetylacetone sodium were dissolved in DMSO-$d_6$ (0.75 ml) by heating, and the solution was then added in a NMR tube. The reaction solution was analyzed by $^1$H-NMR, and the result showed that in addition to a cyclometalated iridium complex (C-1), an unreacted ligand (L-1) and unidentified impurities were contained in an amount of 50% or more. This revealed that the chlorine-crosslinked iridium dimer (D-1) obtained in Comparative Example 1 had a low purity.

\<Example 23\> Synthesis of Cyclometalated Iridium Complex (C-2)

[Chemical Formula 40]

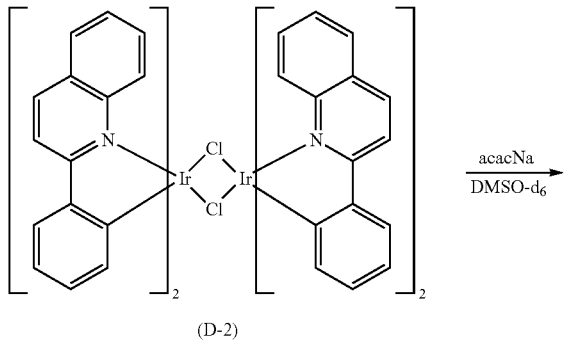

(D-2)

(C-2)

6.0 mg of the chlorine-crosslinked iridium dimer (D-2) obtained in Example 3, and 6.0 mg of acetylacetone sodium were dissolved in DMSO-$d_6$ (0.75 ml) by heating, and the solution was then added in a NMR tube. The reaction solution was analyzed by $^1$H-NMR, and the result showed that the chlorine-crosslinked iridium dimer (D-2) completely disappeared, and a cyclometalated iridium complex (C-2) was quantitatively produced. This revealed that the chlorine-crosslinked iridium dimer (D-2) obtained in Example 3 had an extremely high purity.

\<Comparative Example 7\> Synthesis of Cyclometalated Iridium Complex (C-2)

6.0 mg of the chlorine-crosslinked iridium dimer (D-2) obtained in Comparative Example 3, and 6.0 mg of acetylacetone sodium were dissolved in DMSO-$d_6$ (0.75 ml) by heating, and the solution was then added in a NMR tube. The reaction solution was analyzed by $^1$H-NMR, and the result showed that in addition to a cyclometalated iridium complex (C-2), an unreacted ligand (L-2) and unidentified impurities were contained in an amount of 50% or more. It was revealed that the chlorine-crosslinked iridium dimer (D-2) obtained in Comparative Example 3 had a low purity.

Examples 22 and 23 revealed that it was possible to produce a desired cyclometalated iridium complex with a high purity by using the halogen-crosslinked dimer obtained by the production method of the present invention. The results of Comparative Examples 6 and 7 showed that a halogen-crosslinked iridium dimer obtained by a previously known method using chlorine iridium as a starting material contained an unreacted ligand and black decomposed products in a large amount, and when the halogen-crosslinked iridium dimer was used, the yield and purity of a desired cyclometalated iridium complex were extremely reduced.

INDUSTRIAL APPLICABILITY

The present invention allows a halogen-crosslinked iridium dimer as a precursor of a cyclometalated iridium complex to be produced with a favorable yield and with a favorable purity. The cyclometalated iridium complex can be produced with a favorable yield and with a favorable purity by using the halogen-crosslinked iridium dimer produced according to the present invention. The present invention provides a raw material for production of a cyclometalated iridium complex that is used as a phosphorescent material to be used for organic electroluminescent (EL) devices, organic electrochemiluminescent (ECL) devices, luminescent sensors, photosensitizing pigments, photocatalysts, luminescent probes, various light sources, and the like.

The invention claimed is:

1. A method for producing a halogen-crosslinked iridium dimer represented by the Formula (3):

Formula (3)

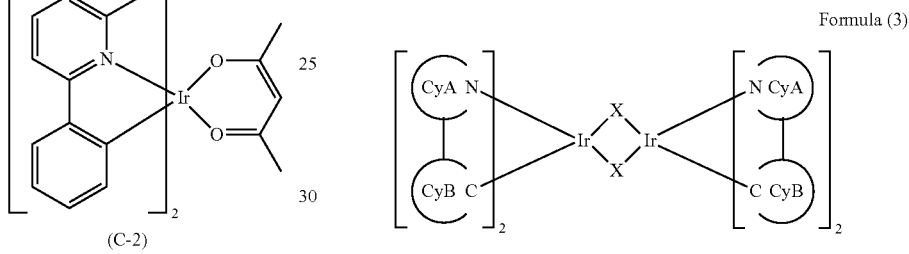

wherein:
each X represents a halogen atom; and
each

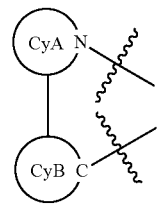

represents Formula (4), Formula (5), Formula (6), Formula (7), Formula (9), Formula (10), Formula (11), Formula (12), Formula (13), or Formula (14):

[Chemical Formula 4]

Formula (4)

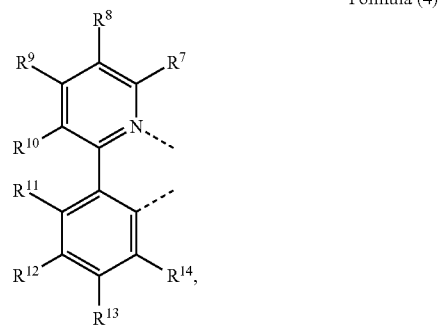

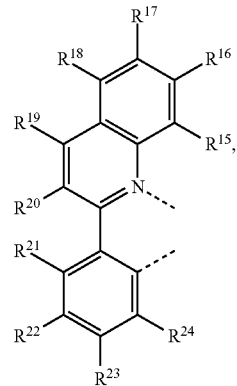
Formula (5)
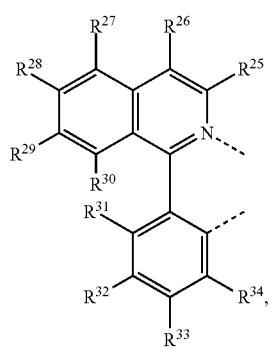
Formula (6)
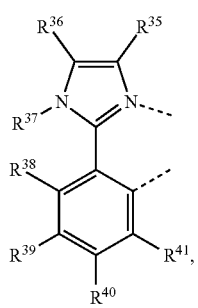
Formula (7)
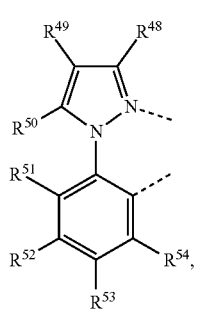
Formula (9)
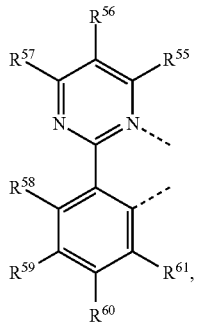
Formula (10)
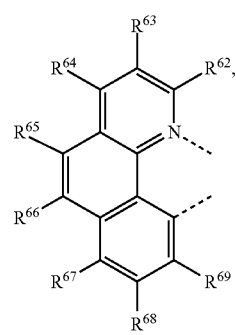
Formula (11)
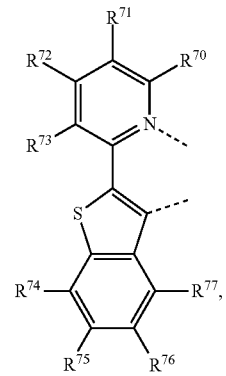
Formula (12)
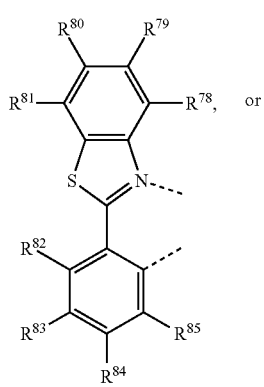
Formula (13)

-continued

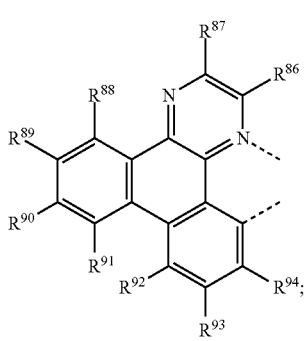

Formula (14)

wherein:
$R^7$, $R^8$, $R^9$, $R^{10}$, $R^{11}$, $R^{12}$, $R^{13}$, $R^{14}$, $R^{15}$, $R^{16}$, $R^{17}$, $R^{18}$, $R^{19}$, $R^{20}$, $R^{21}$, $R^{22}$, $R^{23}$, $R^{24}$, $R^{25}$, $R^{26}$, $R^{27}$, $R^{28}$, $R^{29}$, $R^{30}$, $R^{31}$, $R^{32}$, $R^{33}$, $R^{34}$, $R^{35}$, $R^{36}$, $R^{37}$, $R^{38}$, $R^{39}$, $R^{40}$, $R^{41}$, $R^{48}$, $R^{49}$, $R^{50}$, $R^{51}$, $R^{52}$, $R^{53}$, $R^{54}$, $R^{55}$, $R^{56}$, $R^{57}$, $R^{58}$, $R^{59}$, $R^{60}$, $R^{61}$, $R^{62}$, $R^{63}$, $R^{64}$, $R^{65}$, $R^{66}$, $R^{67}$, $R^{68}$, $R^{69}$, $R^{70}$, $R^{71}$, $R^{72}$, $R^{73}$, $R^{74}$, $R^{75}$, $R^{76}$, $R^{77}$, $R^{78}$, $R^{79}$, $R^{80}$, $R^{81}$, $R^{82}$, $R^{83}$, $R^{84}$, $R^{85}$, $R^{86}$, $R^{87}$, $R^{88}$, $R^{89}$, $R^{90}$, $R^{91}$, $R^{92}$, $R^{93}$, and $R^{94}$ independently represent hydrogen, alkyl, alkenyl, alkynyl, aryl, amino, alkoxy, aryloxy, heterocyclyloxy, acyl, alkoxycarbonyl, aryloxycarbonyl, acyloxy, acylamino, alkoxycarbonylamino, aryloxycarbonylamino, sulfonylamino, sulfamoyl, carbamoyl, alkylthio, arylthio, alkylsulfonyl, alkylsulfinyl, ureido, phosphoramido, hydroxy, mercapto, halogen, cyano, sulfo, carboxy, nitro, trifluoromethyl, hydroxamic acid, sulfino, hydrazino, imino, heterocyclyl, trialkylsilyl, or trialkylsilyloxy;

the method comprising:
reacting an iridium compound represented by the Formula (1):

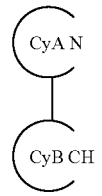

Formula (1)

wherein:
$R^1$ represents hydrogen, alkyl, or aryl, wherein the alkyl or aryl is optionally substituted with one or more halogens;
$R^2$ represents hydrogen, alkyl, or aryl, wherein the alkyl or aryl is optionally substituted with one or more halogens;
$R^3$ represents hydrogen, alkyl, or aryl, wherein the alkyl or aryl is optionally substituted with one or more halogens;
$R^4$ represents hydrogen, alkyl, or aryl, wherein the alkyl or aryl is optionally substituted with one or more halogens;
$R^5$ represents hydrogen, alkyl, or aryl, wherein the alkyl or aryl is optionally substituted with one or more halogens;
$R^6$ represents hydrogen, alkyl, or aryl, wherein the alkyl or aryl is optionally substituted with one or more halogens;
each X represents a halogen atom; and
Y represents a counter cation selected from the group consisting of a proton, a sodium cation, a potassium cation, an ammonium cation, a phosphonium cation, a sulfonium cation, a pyrrolidinium cation, a piperidinium cation, an imidazolium cation, and a pyridinium cation;

with an aromatic bidentate ligand represented by the Formula (2):

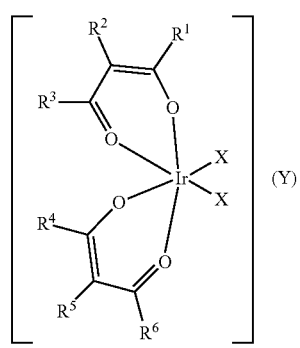

Formula (2)

wherein:
Formula (2) represents Formula (4), Formula (5), Formula (6), Formula (7), Formula (9), Formula (10), Formula (11), Formula (12), Formula (13), or Formula (14):

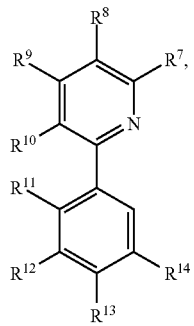

Formula (4)

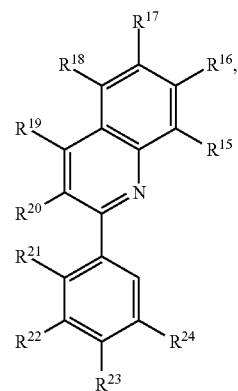

Formula (5)

Formula (6)

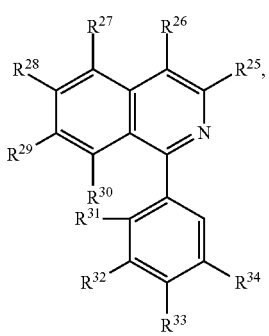

Formula (7)

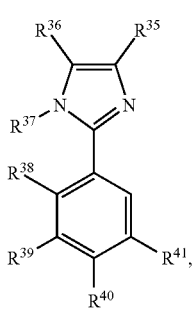

Formula (9)

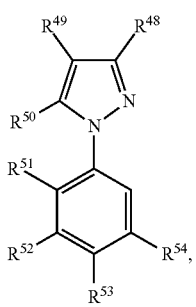

Formula (10)

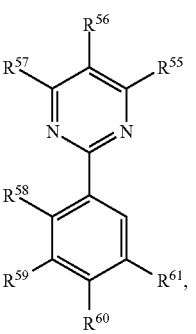

Formula (11)

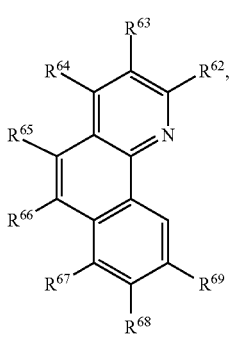

Formula (12)

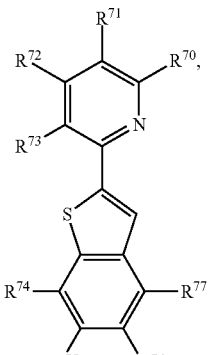

Formula (13)

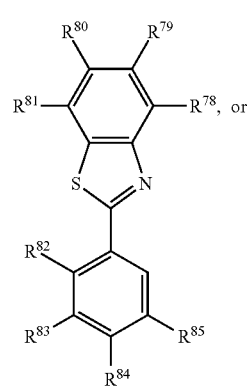

Formula (14)

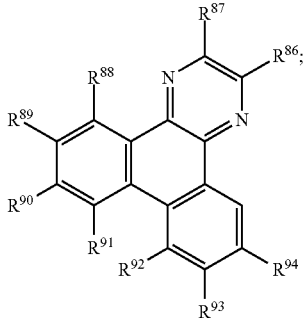

wherein:
$R^7$, $R^8$, $R^9$, $R^{10}$, $R^{11}$, $R^{12}$, $R^{13}$, $R^{14}$, $R^{15}$, $R^{16}$, $R^{17}$, $R^{18}$, $R^{19}$, $R^{20}$, $R^{21}$, $R^{22}$, $R^{23}$, $R^{24}$, $R^{25}$, $R^{26}$, $R^{27}$, $R^{28}$, $R^{29}$, $R^{30}$, $R^{31}$, $R^{32}$, $R^{33}$, $R^{34}$, $R^{35}$, $R^{36}$, $R^{37}$, $R^{38}$, $R^{39}$, $R^{40}$, $R^{41}$, $R^{48}$, $R^{49}$, $R^{50}$, $R^{51}$, $R^{52}$, $R^{53}$, $R^{54}$, $R^{55}$, $R^{56}$, $R^{57}$, $R^{58}$, $R^{59}$, $R^{60}$, $R^{61}$, $R^{62}$, $R^{63}$, $R^{64}$, $R^{65}$, $R^{66}$, $R^{67}$, $R^{68}$, $R^{69}$, $R^{70}$, $R^{71}$, $R^{72}$, $R^{73}$, $R^{74}$, $R^{75}$, $R^{76}$, $R^{77}$, $R^{78}$, $R^{79}$, $R^{80}$, $R^{81}$, $R^{82}$, $R^{83}$, $R^{84}$, $R^{85}$, $R^{86}$, $R^{87}$, $R^{88}$, $R^{89}$, $R^{90}$, $R^{91}$, $R^{92}$, $R^{93}$, and $R^{94}$ independently represent hydrogen, alkyl, alkenyl, alkynyl, aryl, amino, alkoxy, aryloxy, heterocyclyloxy, acyl, alkoxycarbonyl, aryloxycarbonyl, acyloxy, acylamino, alkoxycarbonylamino, aryloxycarbonylamino, sulfonylamino, sulfamoyl, carbamoyl, alkylthio, arylthio, alkylsulfonyl, alkylsulfinyl, ureido, phosphoramido, hydroxy, mercapto, halogen, cyano, sulfo, carboxy, nitro, trifluoromethyl, hydroxamic acid, sulfino, hydrazino, imino, heterocyclyl, trialkylsilyl, or trialkylsilyloxy;
in the presence of a solvent having a boiling point in the range of 50° C. to 350° C.;
wherein the reaction between the iridium compound represented by the Formula (1) and the aromatic bidentate ligand represented by the Formula (2) is performed under atmospheric pressure; and wherein the molar ratio of the aromatic bidentate ligand represented by the Formula (2) to the iridium compound represented by the Formula (1) is in the range of 0.5 to 10.

2. The method according to claim 1, wherein the aromatic bidentate ligand represented by the Formula (2) represents Formula (4), Formula (7), Formula (9), or Formula (10):

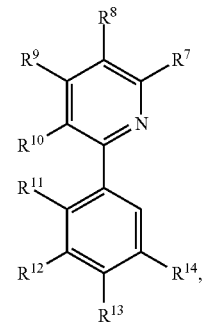

Formula (4)

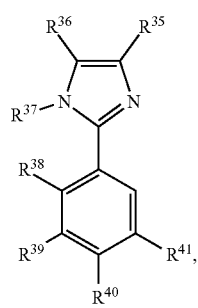

Formula (7)

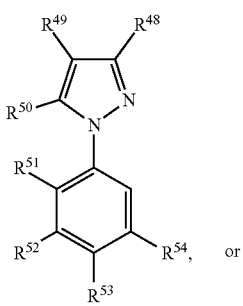

Formula (9)

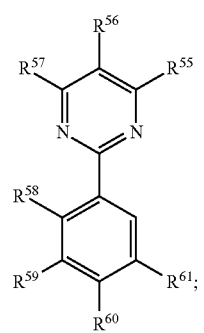

Formula (10)

wherein:

$R^7$, $R^8$, $R^9$, $R^{10}$, $R^{11}$, $R^{12}$, $R^{13}$, $R^{14}$, $R^{35}$, $R^{36}$, $R^{37}$, $R^{38}$, $R^{39}$, $R^{40}$, $R^{41}$, $R^{48}$, $R^{49}$, $R^{50}$, $R^{51}$, $R^{52}$, $R^{53}$, $R^{54}$, $R^{55}$, $R^{56}$, $R^{57}$, $R^{58}$, $R^{59}$, $R^{60}$, and $R^{61}$ independently represent hydrogen, alkyl, alkenyl, alkynyl, aryl, amino, alkoxy, aryloxy, heterocyclyloxy, acyl, alkoxycarbonyl, aryloxycarbonyl, acyloxy, acylamino, alkoxycarbonylamino, aryloxycarbonylamino, sulfonylamino, sulfamoyl, carbamoyl, alkylthio, arylthio, alkylsulfonyl, alkylsulfinyl, ureido, phosphoramido, hydroxy, mercapto, halogen, cyano, sulfo, carboxy, nitro, trifluoromethyl, hydroxamic acid, sulfino, hydrazino, imino, heterocyclyl, trialkylsilyl, or trialkylsilyloxy.

3. The method according to claim 1, wherein the aromatic bidentate ligand represented by the Formula (2) represents Formula (11) or Formula (14):

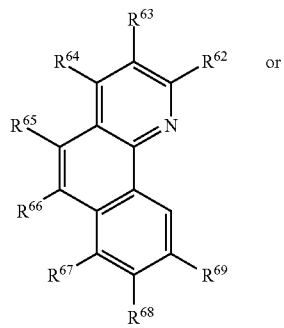

Formula (11)

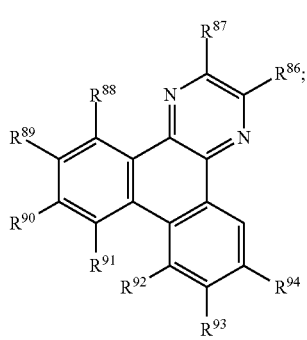

Formula (14)

wherein:

$R^{62}$, $R^{63}$, $R^{64}$, $R^{65}$, $R^{66}$, $R^{67}$, $R^{68}$, $R^{69}$, $R^{86}$, $R^{87}$, $R^{88}$, $R^{89}$, $R^{90}$, $R^{91}$, $R^{92}$, $R^{93}$, and $R^{94}$ independently represent hydrogen, alkyl, alkenyl, alkynyl, aryl, amino, alkoxy, aryloxy, heterocyclyloxy, acyl, alkoxycarbonyl, aryloxycarbonyl, acyloxy, acylamino, alkoxycarbonylamino, aryloxycarbonylamino, sulfonylamino, sulfamoyl, carbamoyl, alkylthio, arylthio, alkylsulfonyl, alkylsulfinyl, ureido, phosphoramido, hydroxy, mercapto, halogen, cyano, sulfo, carboxy, nitro, trifluoromethyl, hydroxamic acid, sulfino, hydrazino, imino, heterocyclyl, trialkylsilyl, or trialkylsilyloxy.

* * * * *